United States Patent
Xu et al.

(10) Patent No.: US 10,091,512 B2
(45) Date of Patent: Oct. 2, 2018

(54) ADVANCED SCREEN CONTENT CODING WITH IMPROVED PALETTE TABLE AND INDEX MAP CODING METHODS

(71) Applicant: Futurewei Technologies, Inc., Plano, TX (US)

(72) Inventors: Meng Xu, Santa Clara, CA (US); Wei Wang, San Jose, CA (US); Zhan Ma, Fremont, CA (US); Xian Wang, Cupertino, CA (US); Haoping Yu, Carmel, IN (US)

(73) Assignee: Futurewei Technologies, Inc., Plano, TX (US)

( * ) Notice: Subject to any disclaimer, the term of this patent is extended or adjusted under 35 U.S.C. 154(b) by 393 days.

(21) Appl. No.: 14/719,064

(22) Filed: May 21, 2015

(65) Prior Publication Data

US 2015/0341643 A1    Nov. 26, 2015

Related U.S. Application Data

(60) Provisional application No. 62/002,556, filed on May 23, 2014.

(51) Int. Cl.
*H04B 1/66* (2006.01)
*H04N 19/136* (2014.01)
(Continued)

(52) U.S. Cl.
CPC ............ *H04N 19/136* (2014.11); *G06K 9/46* (2013.01); *H04N 19/176* (2014.11);
(Continued)

(58) Field of Classification Search
CPC ......... H03M 7/30; H04N 19/91; H04N 19/70; H04N 19/463; H04N 19/42; H04N 19/186;
(Continued)

(56) References Cited

U.S. PATENT DOCUMENTS

| 4,620,233 A | 10/1986 | Ogawa et al. |
| 5,463,702 A | 10/1995 | Trueblood |

(Continued)

FOREIGN PATENT DOCUMENTS

| CN | 105900432 A | 8/2016 |
| CN | 106030651 A | 10/2016 |

(Continued)

OTHER PUBLICATIONS

Office Action dated Dec. 22, 2017, 27 pages, U.S. Appl. No. 14/664,284, filed Mar. 20, 2015.
(Continued)

*Primary Examiner* — Sathyanaraya V Perungavoor
*Assistant Examiner* — Peet Dhillon
(74) *Attorney, Agent, or Firm* — Conley Rose, P.C.

(57) ABSTRACT

An apparatus is configured to perform a method for screen content encoding. The method includes deriving a palette table and a color index map based on a coding unit (CU). The method also includes encoding the palette table and encoding the color index map. The method further includes combining the encoded palette table and the encoded color index map for transmission to a receiver, where the palette table and index map are decoded to reconstruct a pixel block.

13 Claims, 12 Drawing Sheets

(51) Int. Cl.
*H04N 19/176* (2014.01)
*H04N 19/423* (2014.01)
*H04N 19/44* (2014.01)
*G06K 9/46* (2006.01)
*H04N 19/593* (2014.01)
*H04N 19/463* (2014.01)
*G06T 9/00* (2006.01)
*H03M 7/30* (2006.01)
*H04N 19/70* (2014.01)
*H04N 19/91* (2014.01)
*H04N 19/186* (2014.01)
*H04N 19/42* (2014.01)

(52) U.S. Cl.
CPC ........... *H04N 19/423* (2014.11); *H04N 19/44* (2014.11); *H04N 19/463* (2014.11); *H04N 19/593* (2014.11); *G06T 9/00* (2013.01); *H03M 7/30* (2013.01); *H04N 19/186* (2014.11); *H04N 19/42* (2014.11); *H04N 19/70* (2014.11); *H04N 19/91* (2014.11)

(58) Field of Classification Search
CPC .. H04N 19/593; H04N 19/136; H04N 19/423; H04N 19/176; H04N 19/44; G06T 9/00; G06K 9/46
See application file for complete search history.

(56) References Cited

U.S. PATENT DOCUMENTS

| | | |
|---|---|---|
| 5,848,195 A | 12/1998 | Romriell |
| 5,930,390 A | 7/1999 | Coelho |
| 6,522,783 B1 | 2/2003 | Zeng et al. |
| 6,597,812 B1 | 7/2003 | Fallon et al. |
| 7,162,077 B2 | 1/2007 | Li |
| 7,343,037 B1 | 3/2008 | Kadatch |
| 2002/0101536 A1 | 8/2002 | Cook et al. |
| 2003/0048943 A1 | 3/2003 | Ishikawa |
| 2003/0169932 A1 | 9/2003 | Li et al. |
| 2003/0202697 A1 | 10/2003 | Simard et al. |
| 2005/0276489 A1 | 12/2005 | Ishikawa |
| 2007/0083546 A1 | 4/2007 | Minamino et al. |
| 2007/0116370 A1 | 5/2007 | Smirnov |
| 2007/0171489 A1 | 7/2007 | Oyanagi et al. |
| 2007/0188514 A1 | 8/2007 | Li |
| 2007/0195369 A1 | 8/2007 | McDowell et al. |
| 2007/0280295 A1 | 12/2007 | Uchimura |
| 2008/0152221 A1 | 6/2008 | Kadatch |
| 2008/0310740 A1 | 12/2008 | Strom et al. |
| 2009/0010533 A1 | 1/2009 | Hung |
| 2009/0214138 A1 | 8/2009 | Liao et al. |
| 2010/0220937 A1 | 9/2010 | Furbeck |
| 2010/0329548 A1 | 12/2010 | Yoshimura |
| 2011/0243471 A1 | 10/2011 | Alshina et al. |
| 2012/0275697 A1 | 11/2012 | McDowell et al. |
| 2013/0114893 A1 | 5/2013 | Alakuijala |
| 2013/0129237 A1 | 5/2013 | Yie et al. |
| 2013/0148721 A1 | 6/2013 | Chen et al. |
| 2013/0272419 A1* | 10/2013 | Song ................. H04N 19/52 375/240.16 |
| 2014/0078342 A1 | 3/2014 | Li et al. |
| 2014/0147040 A1 | 5/2014 | Tanaka et al. |
| 2014/0301475 A1 | 10/2014 | Guo et al. |
| 2015/0016501 A1 | 1/2015 | Guo et al. |
| 2015/0186100 A1* | 7/2015 | Tsai .................. G06F 3/1454 375/240.12 |
| 2015/0264363 A1 | 9/2015 | Pu et al. |
| 2015/0264365 A1 | 9/2015 | Tsai et al. |
| 2015/0271505 A1 | 9/2015 | Ma et al. |
| 2015/0281688 A1 | 10/2015 | Yie et al. |
| 2016/0277760 A1 | 9/2016 | Li et al. |

FOREIGN PATENT DOCUMENTS

| | | |
|---|---|---|
| EP | 1104176 A2 | 5/2001 |
| RU | 2407222 C2 | 12/2010 |
| WO | 2009002603 A1 | 12/2008 |
| WO | 2011068360 A2 | 6/2011 |
| WO | 2013046096 A1 | 4/2013 |
| WO | 2015054812 A1 | 4/2015 |
| WO | 2015077720 A1 | 5/2015 |
| WO | 2015103496 A2 | 7/2015 |

OTHER PUBLICATIONS

Ma, Z., et al., "Adcanced Screen Content Coding Using Color Table and Index Map," IEEE Transactions on Image Processing, vol. 23, No. 10, Oct. 2014, pp. 4399-4412.

Ma, Z., et al., "Description of screen content coding technology proposal by Huawei," Joint Collaborative Team on Video Coding (JCT-VC) of ITU-T SG16 WP3 and ISO/IEC JTC1/SC29/WG11, JCTVC-Q0034-r1, Mar. 27-Apr. 4, 2014, 22 pages.

Xiu, X., et al., "Description of screen content coding technology proposal by InterDigital," Joint Collaborative Team on Video Coding (JCT-VC) of ITU-T SG16 WP3 and ISO/IEC JTC1/SC29/WG11, JCTVC-Q0037, Mar. 27-Apr. 4, 2014, 30 pages.

Zhu, J., et al., "AHG10: Modified copy above mode for palette based coding," Joint Collaborative Team on Video coding (JCT-VC) of ITU-T SG16 WP3 and ISO/IEC JTC1/SC29/WG11, JCTVC-Q0174, Mar. 27-Apr. 4, 2014, 3 pages.

Wang, W., et al., "AHG8: String match in coding of screen content," Joint Collaborative Team on Video Coding (JCT-VC) of ITU-T SG16 WP3 and ISO/IEC JTC1/SC29/WG11, JCTVC-Q0176-r1, Mar. 27-Apr. 4, 2014, 12 pages.

Huang, Y., et al., "Description of Screen Content Core Experiment 3 (SCCE3): Palette mode," Joint Collaborative Team on Video Coding (JCT-VC) of ITU-T SG16 WP3 and ISO/IEC JTC1/SC29/WG11, JCTVC-Q1123, Mar. 27-Apr. 4, 2014, 11 pages.

Foreign Communication From a Counterpart Application, European Application No. 15795914.9, Extended European Search Report dated Jul. 8, 2016, 10 pages.

Chaumont, M., et al., "A 8-Bit-Grey-Level Image Embedding ITS 512 Color Palette," EURASIP, 16th European Signal Processing Conference, Dec. 19, 2008, 6 pages.

Ivanov, D., et al., "Color Distribution—a new approach to texture compression," XP009008909, Eurographics, vol. 19, No. 3, Aug. 21, 2000, 8 pages.

Guo, L., et al., "Color Palette for Screen Content Coding," XP055179887, ICIP, Oct. 2014, pp. 5556-5560.

Lan, C., et al., "Compress Compound Images in H.264/MPGE-4 AVC by Exploiting Spatial Correlation," IEEE Transactions on Image Processing, vol. 19, No. 4, Apr. 2010, pp. 946-957.

Lan, C., et al., "Intra and inter coding tools for screen contents," JCTVC-E145, Mar. 16-23, 2011, 12 pages.

Sullivan, G.J., et al., "Standardized Extensions of High Efficiency Video Coding (HEVC)," TR2013-105, Oct. 2013, 19 pages.

Zhu, W., et al., "Template-based palette prediction," XP30114648, JCTVC-N0169, Apr. 18-26, 2013, 8 pages.

Chen, J., et al., "Description of screen content coding technology proposal by Qualcomm," XP30115915, JCTVC-Q0031, Mar. 27-Apr. 4, 2014, 18 pages.

Chen, C., et al., "Description of screen content coding technology proposal by NCTU and ITRI International," XP30115917, JCTVC-Q0032, Mar. 27-Apr. 4, 2014, 26 pages.

Lai, P., et al., "Description of screen content coding technology proposal by MediaTek," XP30115919, JCTVC-Q0033, Mar. 27-Apr. 4, 2014, 32 pages.

Ma, Z., et al., "Description of screen content coding technology proposal by Huawei Technologies, Inc.," XP30115921, JCTVC-Q0034, Mar. 27-Apr. 4, 2014, 14 pages.

Lin, T., "Mixed Chroma Sampling-rate coding: combining the merits of 4:4:4 and 4:2:0 and increasing the value of past 4:2:0 investment," XP030111092, JCTVC-H0065, Feb. 1-10, 2012, 5 pages.

(56) References Cited

OTHER PUBLICATIONS

Guo, L., et al., "Palette Mode for Screen Content Coding," JCTVC-M0323, Apr. 18-26, 2013, 12 pages.

Xu, J., et al., "Non-RCE3: base color merging for MBCIM," JCTVC-N0235, Jul. 25-Aug. 2, 2013, 8 pages.

Foreign Communication From a Counterpart Application, European Application No. 15764799.1, Extended European Search Report dated Jan. 23, 2017, 18 pages.

Foreign Communication From a Counterpart Application, PCT Application No. PCT/CN2015/079635, International Search Report dated Jul. 28, 2015, 7 pages.

Foreign Communication From a Counterpart Application, PCT Application No. PCT/CN2015/079635, Written Opinion dated Jul. 28, 2015, 4 pages.

Foreign Communication From a Counterpart Application, PCT Application No. PCT/US2015/021797, International Search Report dated Jul. 29, 2015, 3 pages.

Foreign Communication From a Counterpart Application, PCT Application No. PCT/US2015/021797, Written Opinion dated Jul. 29, 2015, 5 pages.

Foreign Communication From a Counterpart Application, Russian Application No. 2016124544, Russian Search Report dated Aug. 31, 2017, 2 pages.

Foreign Communication From a Counterpart Application, Russian Application No. 2016124544, English Translation of Russian Search Report dated Aug. 31, 2017, 2 pages.

Foreign Communication From a Counterpart Application, Russian Application No. 2016124544, Russian Office Action dated Sep. 4, 2017, 5 pages.

Foreign Communication From a Counterpart Application, Russian Application No. 2016124544, English Translation of Russian Office Action dated Sep. 4, 2017, 3 pages.

Foreign Communication From a Counterpart Application, European Application No. 15764799.1, Partial Supplementary European Search Report dated Sep. 12, 2016, 10 pages.

Foreign Communication From a Counterpart Application, Japanese Application No. 2016-533032, Japanese Office Action dated Oct. 3, 2017, 3 pages.

Foreign Communication From a Counterpart Application, Japanese Application No. 2016-533032, English Translation of Japanese Office Action dated Oct. 3, 2017, 2 pages.

Foreign Communication From a Counterpart Application, New Zealand Application No. P41870NZ00, New Zealand Office Action dated Aug. 29, 2016, 7 pages.

Foreign Communication From a Counterpart Application, New Zealand Application No. P41870NZ00, New Zealand Office Action dated Jul. 25, 2017, 7 pages.

Foreign Communication From a Counterpart Application, European Application No. 14864463.6, Extended European Search Report dated Sep. 21, 2016, 12 pages.

Foreign Communication From a Counterpart Application, Japanese Application No. 2016-533032, Japanese Office Action dated Jun. 13, 2017, 5 pages.

Foreign Communication From a Counterpart Application, Japanese Application No. 2016-533032, English Translation of Japanese Office Action dated Jun. 13, 2017, 6 pages.

Foreign Communication From a Counterpart Application, PCT Application No. PCT/US14/67155, International Search Report dated Mar. 10, 2015, 10 pages.

Office Action dated Jun. 15, 2017, 31 pages, U.S. Appl. No. 14/664,284, filed Mar. 20, 2015.

Office Action dated Apr. 28, 2017, 3 pages, U.S. Appl. No. 14/549,405, filed Nov. 20, 2014.

Office Action dated Aug. 12, 2016, 17 pages, U.S. Appl. No. 14/549,405, filed Nov. 20, 2014.

Office Action dated Feb. 15, 2017, 26 pages, U.S. Appl. No. 14/549,405, filed Nov. 20, 2014.

Office Action dated Oct. 4, 2017, 21 pages, U.S. Appl. No. 14/549,405, filed Nov. 20, 2014.

Sullivan, G., et al. "Overview of the High Efficiency Video Coding (HEVC) Standard," IEEE Transactions on Circuits and Systems for Video Technology, vol. 22, No. 12, Dec. 2012, pp. 1649-1668.

Foreign Communication From A Counterpart Application, Chinese Application No. 201580016913.5, Chinese Search Report dated Dec. 28, 2017, 7 pages.

Machine Translation and Abstract of Chinese Publication No. CN105900432, Aug. 24, 2016, 13 pages.

Foreign Communication From a Counterpart Application, Chinese Application No. 2015800169135, Chinese Search Report dated Apr. 10, 2018, 3 pages.

Foreign Communication From a Counterpart Application, Chinese Application No. 2015800169135, Chinese Office Action dated Apr. 18, 2018, 9 pages.

\* cited by examiner

FIG. 6

|  14 | 14 | 14 | 17 | 17 | 17 | 17 |  6 |
|----|----|----|----|----|----|----|----|
|  14 | 14 | 17 | 17 |  6 | 11 |  9 |  9 |
|  14 | 17 |  6 | 10 | 10 |  7 | 12 | 12 |
|  17 | 17 | 10 | 10 | 13 | 12 |  3 |  3 |
|   6 | 14 | 10 | 13 |  3 |  3 |  3 |  3 |
|   6 | 10 |  7 | 13 |  3 |  3 |  3 |  3 |
|   6 | 19 | 13 | 13 | 12 |  3 |  3 | 12 |

1301

ADVANCED SCREEN CONTENT CODING WITH IMPROVED PALETTE TABLE AND INDEX MAP CODING METHODS

CROSS-REFERENCE TO RELATED APPLICATION(S) AND CLAIM OF PRIORITY

This application claims priority under 35 U.S.C. § 119(e) to U.S. Provisional Patent Application No. 62/002,556, filed May 23, 2014, entitled "ADVANCED SCREEN CONTENT CODING SOLUTION WITH IMPROVED COLOR TABLE AND INDEX MAP CODING METHODS-PART 3", which is hereby incorporated by reference into this application as if fully set forth herein.

TECHNICAL FIELD

The present disclosure relates generally to screen content coding, and more particularly, to advanced screen content coding with improved color (palette) table and index map coding.

BACKGROUND

Screen content coding creates new challenges for video compression because of its distinct signal characteristics compared to conventional video signals. There are multiple existing techniques for advanced screen content coding, e.g., pseudo string match, color palette coding, and intra motion compensation or intra block copy. Among these techniques, pseudo string match shows the highest gain for lossless coding, but with significant complexity overhead and difficulties on lossy coding mode. Color palette coding is developed for screen content under the assumption that non-camera captured content (e.g., computer-generated content) typically contains a limited number of distinct colors, rather than the continuous or near-continuous color tones found in many video sequences. Even though the pseudo string match and color palette coding methods showed great potential, intra motion compensation or intra block copy was adopted into the working draft (WD) version 4 and reference software of the on-going High Efficiency Video Coding (HEVC) range extension for screen content coding. However, the coding performance of intra block copy is bounded because of its fixed block decomposition. Performing block matching (similar to motion estimation in intra picture) also increases the encoder complexity significantly on both computing and memory access.

SUMMARY

According to one embodiment, there is provided a method for screen content encoding. The method includes deriving a palette table and a color index map based on a coding unit (CU). The method also includes encoding the palette table and encoding the color index map. The method further includes combining the encoded palette table and the encoded color index map for transmission to a receiver. At the receiver, the palette table and index map are decoded to reconstruct a pixel block.

According to another embodiment, there is provided an apparatus configured for screen content encoding. The apparatus includes at least one memory and at least one processor coupled to the at least one memory. The at least one processor is configured to derive a palette table and a color index map based on a coding unit (CU), encode the palette table, encode the color index map, and combine the encoded palette table and the encoded color index map for transmission to a receiver.

According to yet another embodiment, there is provided a method for screen content decoding. The method includes receiving a compressed video bitstream from a transmitter. The method also includes parsing the video bitstream into at least one of an encoded palette table and an encoded color index map. The method further includes decoding and reconstructing the at least one of the encoded palette table and the encoded color index map, and using the reconstructed palette table and color index map to reconstruct pixels associated with a coding unit (CU).

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 6 illustrates an example color index map for a 64×64 CU in which horizontal or vertical scanning can be used;

DETAILED DESCRIPTION

Figure 1:
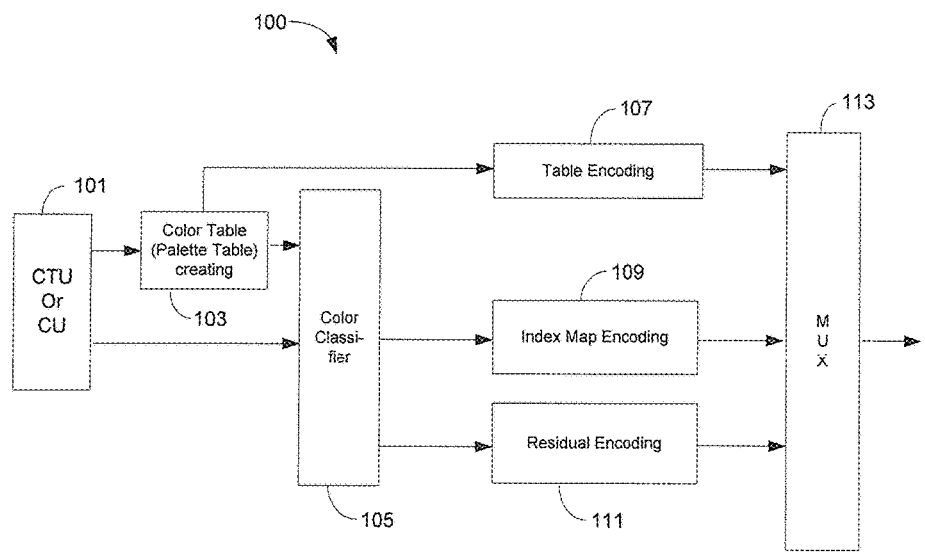
FIG. 1 illustrates a functional block diagram of an example transmitter that performs a screen content coding process according to this disclosure.

FIGS. 1 through 18, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

The following documents and standards descriptions are hereby incorporated into the present disclosure as if fully set forth herein:

T. Lin, S. Wang, P. Zhang, K. Zhou, "AHG7: Full-chroma (YUV444) dictionary+hybrid dual-coder extension of HEVC", JCT-VC Document, JCTVC-K0133, Shanghai, China, October 2012 (hereinafter "REF1");

W. Zhu, J. Xu, W. Ding, "RCE3 Test 2: Multi-stage Base Color and Index Map", JCT-VC Document, JCTVC-N0287, Vienna, Austria, July 2013 (hereinafter "REF2");

L. Guo, M. Karczewicz, J. Sole, "RCE3: Results of Test 3.1 on Palette Mode for Screen Content Coding", JCT-VC Document, JCTVC-N0247, Vienna, Austria, July 2013 (hereinafter "REF3");

L. Guo, M. Karczewicz, J. Sole, R. Joshi, "Non-RCE3: Modified Palette Mode for Screen Content Coding", JCT-VC Document, JCTVC-N0249, Vienna, Austria, July 2013 (hereinafter "REF4");

D.-K. Kwon, M. Budagavi, "RCE3: Results of test 3.3 on Intra motion compensation, JCT-VC Document, JCTVC-N0205, Vienna, Austria, July 2013 (hereinafter "REF5");

C. Pang, J. Sole, L. Guo, M. Karczewicz, R. Joshi, "Non-RCE3: Intra Motion Compensation with 2-D MVs", JCT-VC Document, JCTVC-N0256, Vienna, Austria, July 2013 (hereinafter "REF6");

C. Pang, J. Sole, L. Guo, M. Karczewicz, R. Joshi, "Non-RCE3: Pipeline Friendly Intra Motion Compensation", JCT-VC Document, JCTVC-N0254, Vienna, Austria, July 2013 (hereinafter "REF7");

D. Flynn, J. Soel and T. Suzuki, "Range Extension Draft 4", JCTVC-L1005, August 2013 (hereinafter "REF8"); and H. Yu, K. McCann, R. Cohen, and P. Amon, "Draft call for proposals for coding of screen content and medical visual content", ISO/IEC JTC1/SC29/WG11 N13829, July 2013 (hereinafter "REF9").

Embodiments of this disclosure provide an advanced screen content coding process with improved palette table and index map coding. The disclosed embodiments significantly outperform the current version of High-Efficiency Video Coding (HEVC Version 2). The disclosed embodiments include multiple algorithms that are specifically for coding screen content. These algorithms include pixel representation using a palette table (or equivalently, color table), palette table compression, color index map compression, string match, and residual compression. The embodiments disclosed herein are developed, harmonized, and integrated with the HEVC Range Extension (RExt) as future HEVC extensions to support efficient screen content coding. However, these embodiments could additionally or alternatively be implemented with existing video standards or any other suitable video standards. For ease of explanation, HEVC RExt is used herein as an example to describe the various embodiments. Similarly, HEVC RExt software is used to implement the various embodiments to showcase the compression efficiency.

Figure 2:
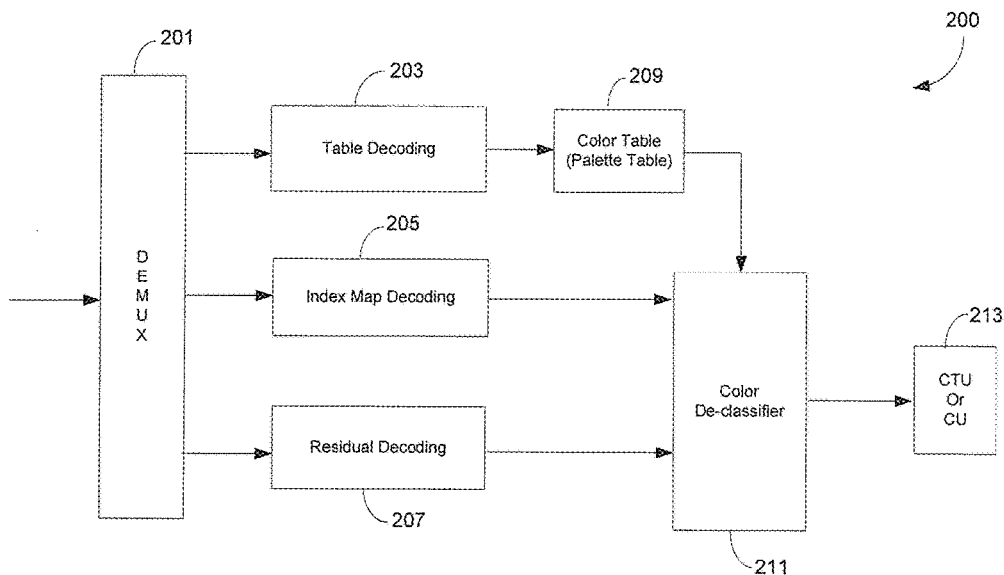
FIG. 2 illustrates a functional block diagram of an example receiver that performs a screen content decoding process according to this disclosure.

FIG. 1 illustrates a functional block diagram of an example transmitter that performs a screen content coding process according to this disclosure. FIG. 2 illustrates a functional block diagram of an example receiver that performs a screen content decoding process according to this disclosure. The embodiments of the transmitter 100 and the receiver 200 are for illustration only. Other embodiments of the transmitter 100 and the receiver 200 could be used without departing from the scope of this disclosure.

Figure 3:
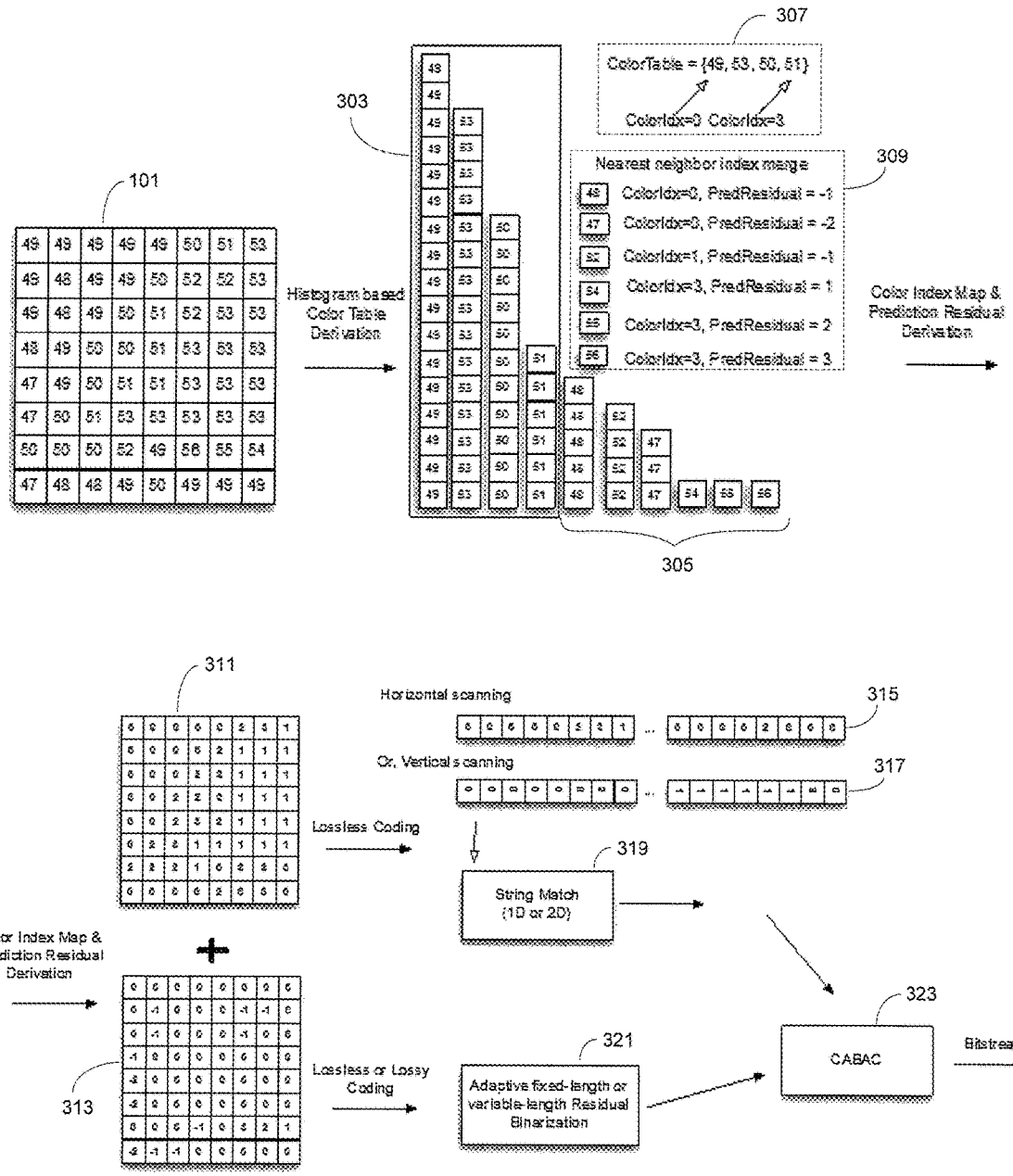
FIG. 3 illustrates an example of various modules and processing flow using a palette table and index map, according to this disclosure.

The transmitter 100 is configured to perform a high-efficiency color palette compression (CPC) process that can be performed on each coding unit (CU) or coding tree unit (CTU) in a bitstream. As shown in FIG. 1, the transmitter 100 starts with a CU 101 in a bitstream. A CU is a basic operating unit in HEVC and HEVC RExt, and is a squared block of pixels that includes three color components (e.g., RGB, YUV, XYZ, or the like, as known in the art). An example CU 101 is shown in FIG. 3. The CU 101 is an 8 pixel×8 pixel CU that includes an explicit color value (e.g., 47, 48, 49, etc.) for each pixel. In other embodiments, the size of the CU 101 may be other than 8×8 pixels (e.g., 16×16 pixels, 32×32 pixels, etc.). In some embodiments, the transmitter 100 may start with a CTU 101 instead of a CU 101. For ease of explanation, the transmitter 100 will be described with a CU 101. Those of skill in the art will understand that the transmitter 100 can perform substantially the same process with a CTU 101.

A palette table creating block 103 uses the CU 101 to derive or generate a palette table (sometimes referred to as a color table). An example palette table 303 is shown in FIG. 3. To derive the palette table 303, the palette table creating block 103 orders the color values according to one or more ordering rules. The palette table 303 can be ordered according to an occurrence frequency of each color value, the actual color intensity of each pixel of the CU 101, or any other suitable ordering metric(s), to increase the efficiency of the following encoding operations.

Based on the derived palette table 303, a color classifier block 105 uses the CU 101 to assign the colors or pixel values of the CU 101 into the color index map 311 and one or more prediction residual maps 313. A table encoding block 107 receives the palette table 303 and encodes the entries in the palette table 303. An index map encoding block 109 encodes the color index map 311 created by the color classifier block 105. These operations are described in greater detail below.

A residual encoding block 111 encodes each prediction residual map 313 created by the color classifier block 105. In some embodiments, the residual encoding block 111 performs adaptive fixed-length or variable-length residual binarization, as indicated at 321 in FIG. 3. Then, a multiplexing (MUX) block 113 generates the compressed bitstream using the string/block matches 319 and the encoded prediction residuals 321. In some embodiments, a context adaptive binary arithmetic coding (CABAC) method 323 can be used to combine the string/block matches 319 and the encoded prediction residuals 321, as shown in FIG. 3.

Turning to FIG. 2, the receiver 200 is configured to perform a screen content decoding process analogous to the screen content encoding process performed the transmitter 100, as described above. The receiver 200 receives the compressed video bitstream, and then, using the de-multiplexer 201, parses the bitstream into an encoded palette table, color index map, and encoded prediction residuals. The table decoding block 203 and palette table creating block 209 perform processes opposite from the table encoding block 107 and the palette table creating block 103 to reconstruct, for each CU, a complete palette table. Similarly, the index map decoding block 205 and residual decoding block 207 perform processes opposite from the index map encoding block 109 and the residual encoding block 111 to reconstruct the color index map. The color de-classifier block 211 derives the pixel value at each position by combing the color index map and palette table, thereby reconstructing a CTU or CU 213.

Although FIGS. 1 and 2 illustrate examples of a transmitter 100 and receiver 200 for performing screen content encoding and decoding, various changes may be made to FIGS. 1 and 2. For example, various components in FIGS. 1 and 2 could be combined, further subdivided, or omitted and additional components could be added according to particular needs. As a particular example, various components could be arranged together in one housing or on one circuit board, or be performed by a single processor or processing unit.

Based on the derived palette table 303, each pixel in the original CU 101 can be converted to its color index within the palette table 303. Embodiments of this disclosure provide methods to efficiently compress the palette table 303 and the color index map 311 (described below) for each CU 101 into the stream. At the receiver side, the compressed bitstream can be parsed to reconstruct, for each CU 101, the complete palette table 303 and the color index map 311, and then further derive the pixel value at each position by combining the color index and palette table.

Figure 4:
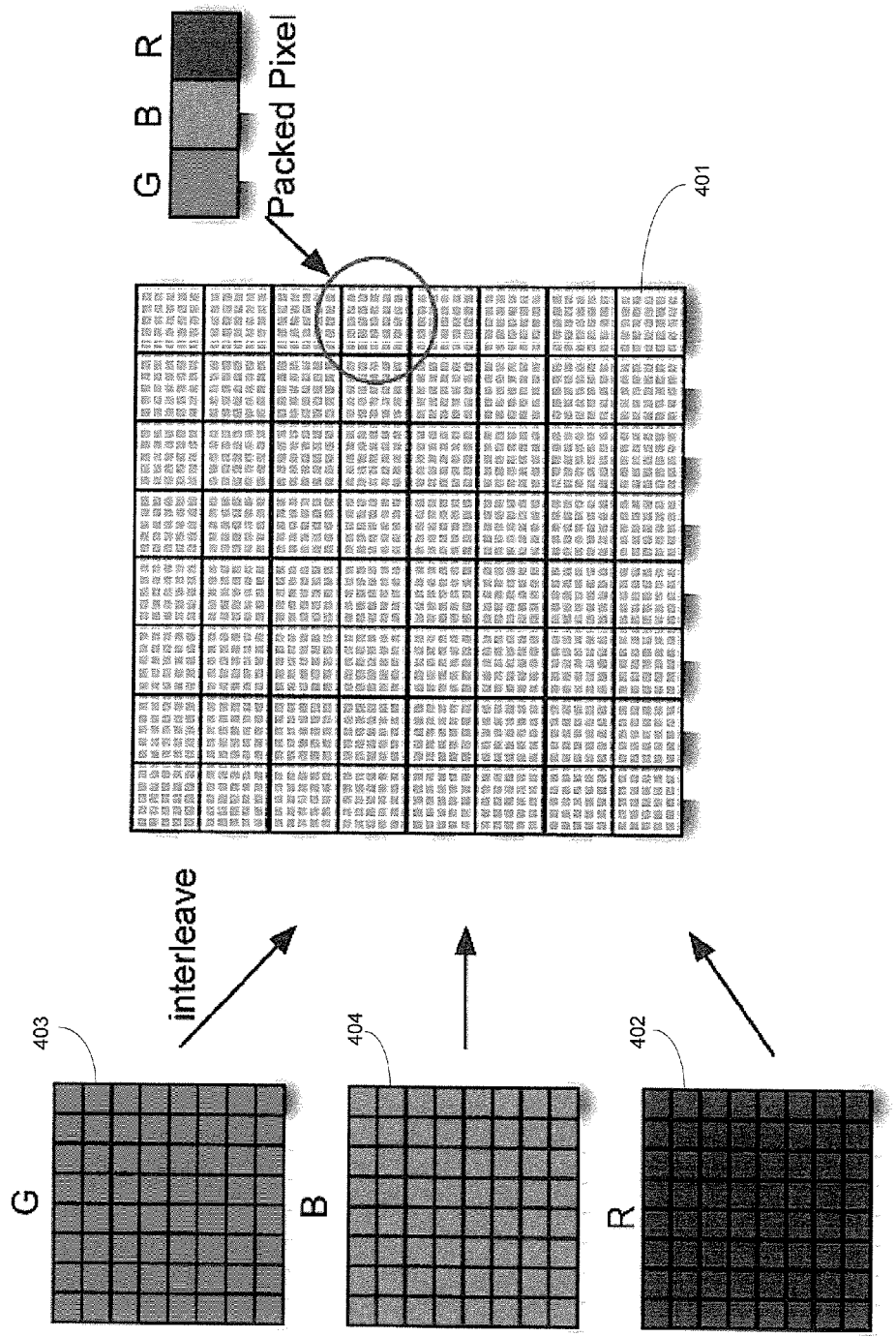
FIG. 4 illustrates an example coding unit (CU) with color components shown separately and packed.

FIG. 4 illustrates another example of a CU 401 with the color components shown separately and packed. The CU 401 may represent the CU 101. As shown in FIG. 4, the CU 401 is an 8 pixel×8 pixel CU. Of course, the CU 401 could be N×N pixels, where N=8, 16, 32, 64 for compatibility with HEVC. Each pixel of the CU 401 includes three color components, at different sampling ratios (e.g., 4:4:4, 4:2:2, 4:2:0). That is, the CU 401 includes separate red (R) color components 402, green (G) color components 403, and blue (B) color components 404. In other embodiments, the color components could be Y, Cb, Cr, or X, Y Z or another suitable combination of components.

For simplicity, sequences of 4:4:4 are used in the disclosure. For 4:2:2 and 4:2:0 videos, chroma upsampling could be applied to obtain the 4:4:4 sequences, or each chroma component 402-404 could be processed independently. In the case of 4:0:0 monochrome videos, these can be treated as an individual plane of 4:4:4 without the other two planes. All methods for 4:4:4 can be applied directly.

The color components 402-404 can be interleaved together in a packing process, resulting in the packed CU 401. In an embodiment, a flag called enable_packed_component_flag is defined for each CU 101 to indicate whether the CU 101 is processed using packed mode (thus resulting in the CU 401) or conventional planar mode (i.e., G, B, R or Y, U, V components 402-404 are processed independently.)

Both packed mode and planar mode can have advantages and disadvantages. For instance, planar mode supports parallel color component processing for G/B/R or Y/U/V. However, planar mode may result in low coding efficiency. Packed mode can share the header information (such as the palette table 303 and color index map 311) for the CU 101 among different color components. However, packed mode might prevent multiple color components from being processed simultaneously or in a parallel fashion. One simple method to decide whether the current CU 101 should be encoded in the packed mode is to measure the rate distortion (R-D) cost.

The enable_packed_component_flag is used to explicitly signal the encoding mode to the decoder. In addition to defining the enable_packed_component_flag at the CU level for low-level handling, the flag can be duplicated in the slice header or even the sequence level (e.g., the Sequence Parameter Set or Picture Parameter Set) to allow slice level or sequence level handling, depending on the specific application requirement.

Palette Table and Index Map Derivation

The following describes operations at the palette table creating block 103 and the table encoding block 107 in FIG. 1. For each CU 101, pixel locations are transversed and the palette table 303 and the color index map 311 for the subsequent processing are derived. Each distinct color is ordered in the palette table 303, depending on either its histogram (i.e., frequency of occurrence), or its intensity, or any arbitrary method in order to increase the efficiency of the encoding process that follows. For example, if the encoding process uses a differential pulse code modulation (DPCM) method to code the difference between adjacent pixels, the optimal coding result can be obtained if the adjacent pixels are assigned with the adjacent color index in the palette table 303.

A new hash based palette table derivation will now be described, which can be used to efficiently determine the major colors and reduce error. For each CU 101, the palette table creating block 103 examines the color value of each pixel in the CU 101 and creates a color histogram using the three color components together, i.e., packed G, B, R or packed Y, Cb, Cr according to the frequency of occurrence of each color in descending order. To represent each 24-bit color, the G and B color components (or Y and Cb color components) can be bit-shifted accordingly. That is, each packed color can be represented according to a value (G<<16)+(B<<8)+(R) or (Y<<16)+(Cb<<8)+(Cr), where <<x is a left bit shift operation. The histogram is sorted according to the frequency of color occurrence in descending order.

For lossy coding, the palette table creating block 103 then applies a hash-based neighboring color grouping process on the histogram-ordered color data to obtain a more compact palette table representation. For each color component, the least significant X bits (depending on quantization parameter (QP)) are cleared and a corresponding hash representation is generated using a hash function (G>>X<<(16+X))|(B>>X<<(8+X))|(R>>X<<X) or (Y>>X<<(16+X))|(Cb>>X<<(8+X))|(Cr>>X<<X), where >>x is a right bit shift operation, and X is determined based on QP. A hash table or alternatively a binary search tree (BST) data structure is exploited for fast seeking colors having the same hash value. For any two hash values, their distance is defined as the maximum absolute difference of the corresponding color components.

During neighboring color grouping, the palette table creating block 103 processes packed colors in descending order of the frequency of occurrence, until N colors have been processed. If the number of colors in the current CU is smaller than N, then all colors in the current CU are processed. N is bounded by a predetermined maximum number of colors (max_num_of_colors). In some embodiments, max_num_of_colors=128, i.e., N<=128. After hash based color grouping, the N chosen colors (or all colors in the case that the number of colors in the current CU is smaller than N), are then reordered by sorting the colors in ascending order based on the value of each packed color. The result is a palette table such as the palette table 303 shown in FIG. 3. The palette table 303 has a size of four colors (i.e., N=4). In many embodiments, N>4. However, for ease of explanation, N is selected as 4 in FIG. 3.

When the number of colors represented in the CU 101 is greater than the number of colors N in the palette table 303, the less-frequently occurring colors are arranged as residuals outside of the palette table 303. For example, the color values 49, 53, 50, and 51 are part of the palette table 303, while the color values 48, 52, 47, 54, 55, and 56 are residual colors 305 outside of the palette table 303.

The derivation of the palette table 303, as performed by the palette table creating block 103, can be described by the following pseudo-code.

```
(Pseudo code):

H = DeriveHistogram( );
H' = CreateEmptyHistorgram( );
processed_color_count = 0;
while( processed_color_count < N and H is not empty )
{
  C = GetMostFrequentColor( H );
  if( lossy coding )
  {
    hash = ComputeHash( C, QP );
    find all colors Cx satisfying: dist( hash,
      ComputeHash( Cx, QP ) ) <= 1;
    merge all colors in Cx to C;
    remove Cx from H;
  }
  save C to H' and remove C from H;
}
H = H';
Reorder( H );
```

In the pseudo-code above, ComputeHash(C, QP) applies the hash function (G>>X<<(16+X))|(B>>X<<(8+X))|(R>>X<<X) or (Y>>X<<(16+X))|(Cb>>X<<(8+X))|(Cr>>X<<X) to generate the hash value, where X is dependent on QP. Dist(hash1, hash2) obtains the maximum absolute difference of the corresponding color components in hash1 and hash2. Here, hash table data and binary search tree structures are utilized to quickly find the colors satisfying a certain condition based on its hash value.

As discussed above, based on the derived palette table 303, the color classifier block 105 uses the CU 101 to assign the colors or pixel values of the CU 101 into the color index map 311 and one or more prediction residual maps 313. That is, the color classifier block 105 assigns each color in the palette table 303 to a color index within the palette table 303. For example, as indicated at 307 in FIG. 3, color 49 is assigned color index 0 (ColorIdx=0), color 53 is assigned color index 1, color 50 is assigned color index 2, and color 51 is assigned color index 3 (ColorIdx=3). Once the colors in the palette table 303 are assigned an index, the color index map 311 can be generated from the CU 101 using the indexes of each color. The processing of the color index map 311 is described in greater detail below. Likewise, each residual color 305 outside of the palette table 303 is assigned a prediction residual value, as indicated at 309. Once the residual colors 305 are assigned a prediction residual value, the prediction residual map 313 can be generated from the CU 101.

For a planar CU, each color component can have its own individual palette table, such as colorTable_Y, colorTable_U, colorTable_V or colorTable_R, colorTable_G, colorTable_B. In some embodiments, the palette table for a major component can be derived, such as Y in YUV or G in GBR, and this table can be shared for all components. Typically, by using a shared Y or G palette table, color components other than Y or G would have some mismatch relative to the original pixel colors from those in the shared palette table. The residual engine (such as HEVC coefficients coding methods) can then be applied to encode those mismatched residuals. On other embodiments, for a packed CU, a single palette table can be shared among all components.

The following pseudo code exemplifies the palette table and index map derivation.

```
(Pseudo code):

deriveColorTableIndexMap( )
{
  deriveColorTable( );
  deriveIndexMap( );
}
deriveColorTable(src, cuWidth, cuHeight, maxColorNum)
{
  // src - input video source in planar or packed mode
  // cuWidth, cuHeight - width and height of current CU
  /* maxColorNum - max num of colors allowed in palette table*/
  /*transverse */
  //
  // memset(colorHist, 0, (1<<bitDepth)*sizeof(UINT))
  pos=0;
  cuSize=cuWidth*cuHeight;
  while (pos<cuSize) {
    colorHist[src[pos++]]++;
  }
  /*just pick non-zero entry in colorHist[ ] for color intensity ordered
  table*/
  j=0;
  for(i=0;i<(1<<bitDepth);i++)
  {
    if(colorHist[i]!=0)
      colorTableIntensity[j++] = colorHist[i];
  }
  colorNum=j;
  /*quicksort for histgram*/
  colorTableHist = quickSort(colorTableIntensity, colorNum);
  /*if maxColorNum >= colorNum, all colors will be picked*/
  /*if maxColorNum < colorNum, only maxColorNum colors will be
  picked for colorTableHist. In this case, all pixels will find its best matched
  color and corresponding index with difference (actual pixel and its
  corresponding color) coded by the residual engine.*/
  /*Best number of colors in palette table could be determined by
  iterative R-D cost derivation!*/
}
deriveIndexMap( )
{
  pos=0;
  cuSize=cuWidth*cuHeight;
  while ( pos < cuSize)
  {
    minErr=MAX_UINT;
    for (i=0;i<colorNum;i++)
    {
      err = abs(src[pos] - colorTable[i]);
      if (err<minErr)
      {
        minErr = err;
        idx = i;
      }
    }
    idxMap[pos] = idx;
  }
}
```

Palette Table Processing

For each CU 101, the transmitter 100 can derive the palette table 303 from the current CU 101 (referred to as explicit palette table carriage) or the transmitter 100 can derive the palette table 303 from a left or upper neighbor of the current CU 101 (referred to as implicit palette table carriage). The table encoding block 107 receives the palette table 303 and encodes the entries in the palette table 303.

Palette table processing involves the encoding of the size of the palette table 303 (i.e., the total number of distinct colors) and each color itself. The majority of the bits are consumed by the encoding of each color in the palette table 303. Hence, the focus will be placed on the color encoding (i.e., the encoding of each entry in the palette table 303).

The most straightforward method to encode the colors in a palette table is using a pulse code modulation (PCM) style algorithm, where each color is coded independently. Alternatively, the nearest prediction for successive color can be applied, and then the prediction delta can be encoded rather than the default color intensity, which is the so-called DPCM (differential PCM) style. Both methods can later be entropy encoded using an equal probability model or adaptive context model, depending on the trade-off between complexity costs and coding efficiency.

Embodiments of this disclosure provide another advanced scheme, called Neighboring Palette Table Merge, where a color_table_merge_flag is defined to indicate whether the current CU (e.g., the CU 101) uses the palette table associated with its left CU neighbor or its upper CU neighbor. If not, the current CU carries the palette table signaling explicitly. This process may also be referred as neighboring palette table sharing. With this merging process, a color_table_merge_direction flag indicates the merging direction, which is either from the upper CU or from the left CU. Of course, the merging direction candidates could be in directions other than the upper CU or left CU (e.g., upper-left, upper-right, and the like). However, the upper CU and left CU are used in this disclosure to exemplify the concept. Each pixel in the current CU is compared with the entries in the existing palette table associated with the left CU or upper CU and assigned an index yielding the least prediction difference (i.e., pixel subtracts the closest color in the palette table) via the deriveIdxMap( ) pseudo code shown above. For the case where the prediction difference is non-zero, all of the residuals are encoded using the HEVC Range Extension (RExt) residual engine. The decision of whether or not to use the table merging process can be determined by the R-D cost.

There are several methods to generate the neighboring palette tables for use in the merging process in coding the current CU. Depending on the implementation, one of the methods (referred to as Method A for ease for explanation) requires updating at both the encoder and the decoder. Another method (referred to as Method B) is an encoder side only process. Both methods will now be described.

Method A: In this method, the palette tables of neighbor CUs are generated upon the available reconstructed pixels, regardless of CU depth, size, etc. For each CU, the reconstructions are retrieved for its neighboring CU at the same size and same depth (assuming the color similarity would be higher in this case).

Figure 5:
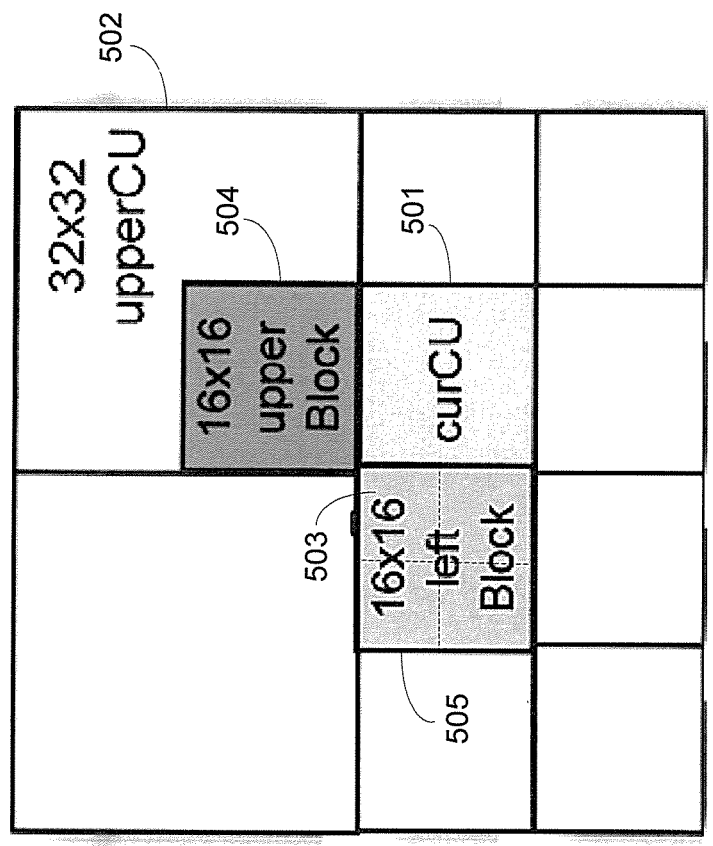
FIG. 5 illustrates an example of palette table prediction using neighboring reconstructed blocks.

FIG. 5 illustrates an example of palette table re-generation using Method A, according to this disclosure. As shown in FIG. 5, a current CU 501 is a 16×16 block with a depth=2. Neighbor CUs of the current CU 501 include an upper CU 502 and a left CU 503. The upper CU 502 is a 32×32 block with a depth=1. The upper CU 502 includes a 16×16 upper block 504. The left CU 503 is an 8×8 block with a depth=3, and is part of a 16×16 block 505. Using Method A, regardless of the partition of its neighboring CUs (e.g., the 8×8 left CU 503 or the 32×32 upper CU 502), the pixel offset (=16) will be located from the origin of the current CU 501 to the left direction to process the left 16×16 block 505 and to the upper direction to process the upper 16×16 block 504. Both the encoder and decoder maintain this offset.

Method B: In this method, the merging process occurs when a current CU shares the same size and depth as its upper CU neighbor and/or its left CU neighbor. The palette tables of the available neighbors are used to derive the color index map of the current CU for subsequent operations. For example, for a current 16×16 CU, if its neighboring CU (i.e., either its upper neighbor or its left neighbor) is encoded using the palette table and index method, the palette table of the neighboring CU is used for the current CU to derive the R-D cost. This merge cost is compared with the case where the current CU derives its palette table explicitly (as well as other conventional modes that may exist in the HEVC or HEVC RExt). Whichever case produces the lowest R-D cost is selected as the mode to be written into the output bit stream. In Method B, only the encoder is required to simulate different potential modes. At the decoder, the color_table_merge_flag and color_table_merge_direction flag indicate the merge decision and merge direction without requiring additional processing by the decoder.

Predictor Palette

To further reduce the complexity, a predictor palette is used to cache the colors that come from the previously coded palette table or another predictor palette, which eventually comes from the previously coded palette table. In one embodiment, the entries in the predictor palette come from the predictor palette or coded palette table of the left or upper CU of the current CU. After a CU is encoded with a color palette, the predictor palette is updated if this CU size is larger than or equal to the CU size associated with the predictor palette and the current palette is different from the predictor palette. If the current CU is not encoded using the palette mode, there is no change to the predictor palette. This is also referred to as predictor palette propagation. This predictor palette may be reset in the beginning of each picture or slice or each CU row.

A number of methods are available for constructing the predictor palette. In a first method, for each CU encoding, the predictor palette is constructed from the predictor palette of its left CU or upper CU. In this method, one predictor palette table is saved for each CU.

A second method is different from the first method in that the palette table, instead of the predictor palette table, associated with the upper CU is used in the prediction process.

Color Index Map Processing/Encoding

Figure 6:
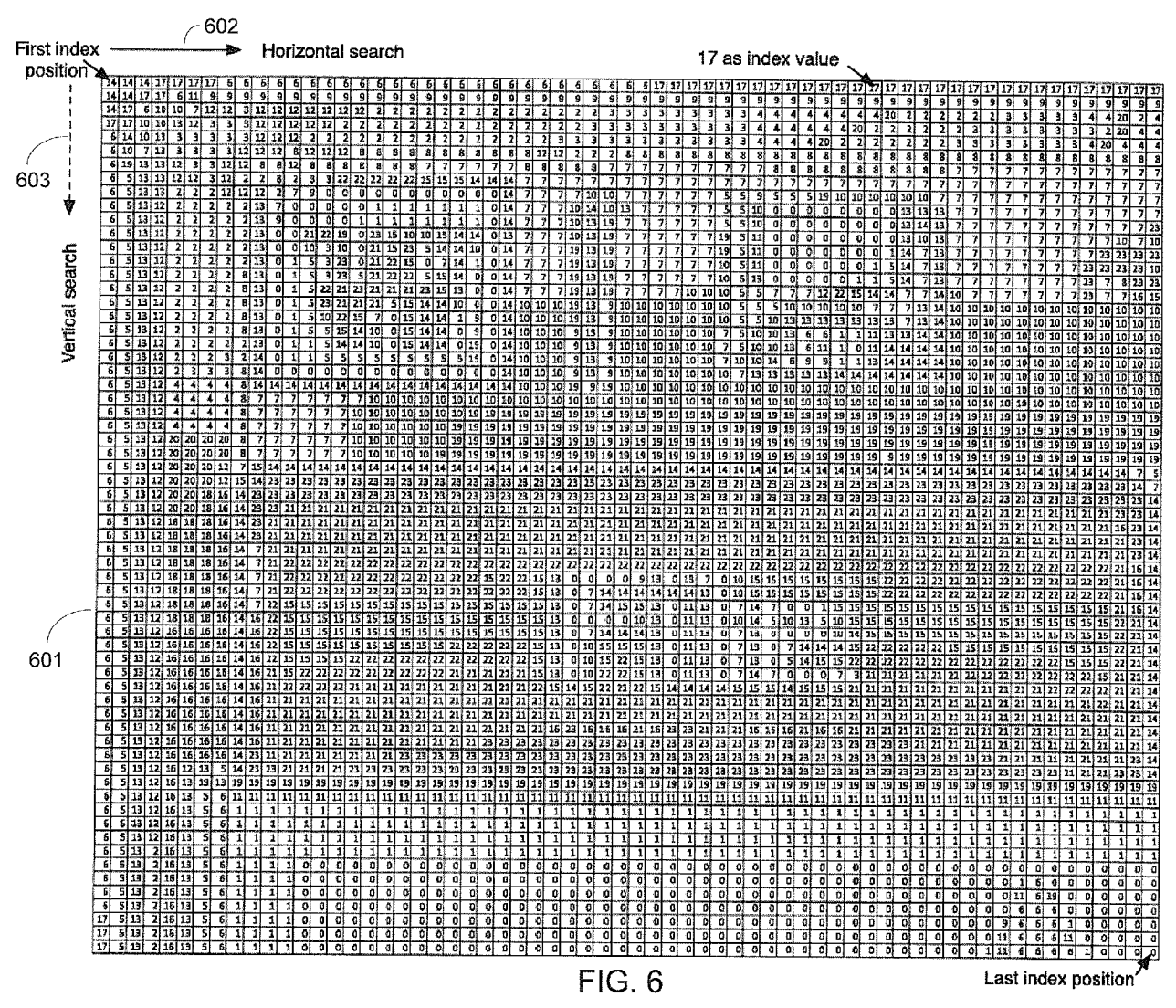

The index map encoding block 109 encodes the color index map 311 created by the color classifier block 105. To encode the color index map 311, the index map encoding block 109 performs at least one scanning operation (horizontal 315 or vertical 317) to convert the two-dimensional (2D) color index map 311 to a one-dimensional (1D) string. Then the index map encoding block 109 performs a string search algorithm (described below) to generate a plurality of matches. In some embodiments, the index map encoding block 109 performs separate horizontal and vertical scanning operations and performs the string search algorithm to determine which provides better results. FIG. 6 illustrates an example of horizontal and vertical scanning operations. In FIG. 6, an example 2D color index map 601 is shown. The color index map 601 can represent the color index map 311 of FIG. 3. The color index map 601 is a 64×64 map, but other sizes of color index map are possible. As shown in FIG. 6, horizontal scanning (or search) 602 or vertical scanning (or search) 603 can be performed on the color index map 601.

Embodiments of this disclosure provide a 1D string matching technique and a 2D variation to encode the color index map 311. At each position, the encoding technique finds a matched point and records the matched distance and length for the 1D string match, or records the width and height of the match for the 2D string match. For an unmatched position, its index intensity, or alternatively, the delta value between its index intensity and predicted index intensity, can be encoded directly.

Figure 7:
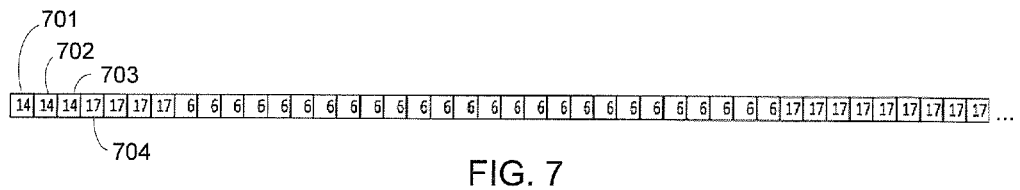
FIG. 7 illustrates a portion of a one dimensional (1D) color index vector after a 1D search using horizontal scanning.

A straightforward 1D search method can be performed over the color index map 601. For example, FIG. 7 illustrates a portion of a 1D color index vector 700 after a 1D search using horizontal scanning from the first index position of the color index map 601. A string search is then applied to the 1D color index vector 700. Looking at the first position 701 of the color index vector 700 (which is '14' as shown in FIG. 7), since there is no buffered reference yet, the first position 701 is treated as an "unmatched pair". The unmatched pair is assigned values −1 and 1 to its corresponding distance and length, notated as (dist, len)=(−1, 1). The second position 702 is another '14'. The second position 702 is the first index coded as reference. Therefore the distance of the matched pair, dist=1. Because there is another '14' at the third position 703, the length of the matched pair is 2, i.e., len=2. Moving along to the fourth position 704, a value of '17' is encountered, which has not been seen before. Hence, the fourth position 704 is encoded as another unmatched pair, i.e., (dist, len)=(−1, 1). For each unmatched pair, the matched/unmatched flag is encoded to signal there is no matched index found for the current index, and this flag is followed by the real value of the index (e.g., the first appearance of '14', '17', '6', etc.). For each matched pair, the matched/unmatched flag is encoded to signal that a matched index string has been found, and this flag is followed by the length of the matched string.

The following is a result set for the encoding technique using the portion of the 1D color index vector 700 shown in FIG. 7.

| | | | |
|---|---|---|---|
| dist = −1, | len = 1, | idx=14 | (unmatched) |
| dist = 1, | len = 2 | | (matched) |
| dist = −1, | len = 1, | idx=17 | (unmatched) |
| dist = 1, | len = 3 | | (matched) |
| dist = −1, | len = 1, | idx= 6 | (unmatched) |
| dist = 1, | len = 25 | | (matched) |
| dist = 30, | len = 4 | | (matched) /*for the "17" which appeared before*/ |
| ... | | | |

The following pseudo code is given for this matched pair derivation.

(Pseudo code):

```
Void deriveMatchedPairs ( TComDataCU* pcCU, Pel* pIdx, Pel* pDist,
Pel* pLen, UInt uiWidth, UInt uiHeight)
{
// pIdx is a idx CU bounded within uiWidth*uiHeight
UInt uiTotal = uiWidth*uiHeight;
UInt uiIdx  = 0;
Int j  = 0;
Int len = 0;
// first pixel coded as itself if there isn't left/upper buffer
pDist[uiIdx] = −1;
pLen[uiIdx] = 0;
uiIdx++;
while (uiIdx < uiTotal )
{
    len  = 0;
    dist  = −1;
    for ( j=uiIdx−1; j >= 0; j−− )
    {
        // if finding matched pair, currently exhaustive search is applied
        // fast string search could be applied
        if ( pIdx[j] == pIdx[uiIdx] )
        {
            for (len = 0; len < (uiTotal−uiIdx); len++ )
            {
                if ( pIdx[j+len] != pIdx[len+uiIdx] )
                    break;
            }
        }
        if ( len > maxLen ) /*better to change with R-D decision*/
```

(Pseudo code):

```
        {
            maxLen = len;
            dist = (uiIdx − j );
        }
    }
}
pDist[uiIdx] = dist;
pLen[uiIdx] = maxLen;
uiIdx = uiIdx + maxLen;
}
}
```

A 2D variation of the 1D string matching technique described above can also be used. The 2D matching technique includes the following steps:

Step 1: The location of the current pixel and a reference pixel are identified as a starting point.

Step 2: A horizontal 1D string search is applied to the right direction of the current pixel and the reference pixel. The maximum search length is constrained by the end of the current horizontal row. The maximum search length can be recorded as right_width.

Step 3: A horizontal 1D string search is applied to the left direction of the current pixel and the reference pixel. The maximum search length is constrained by the beginning of the current horizontal row, and may also be constrained by the right_width of a prior 2D match. The maximum search length can be recorded as left_width.

Step 4: The same 1D string search is performed at the next row, using pixels below the current pixel and the reference pixel as the new current pixel and reference pixel.

Step 5: Stop when right_width==left_ width==0.

Step 6: For each height[n]={1, 2, 3 . . . }, there is a corresponding array of width[n] (e.g., {left_width[1], right_width[1]}, {left_width[2], right_width[2]}, {left_width[3], right_width[3]} . . . }.

Step 7: A new min_width array is defined as {{1width[1], rwidth[1]}, {1width[2], rwidth[2]}, {1width[3], rwidth[3]} for each height[n], where 1width[n]=min(left_width[1:n−1]), rwidth[n]=min(right_width[1:n−1]).

Step 8: A size array{size[1], size[2], size[3] . . . } is also defined, where size[n]=height[n]×(1width[n]+hwidth[n]).

Step 9: Assuming that size[n] hold the maximum value in the size array, the width and height of the 2D string match is selected using the corresponding {1width[n], rwidth[n], height[n]}.

One technique to optimize the speed of a 1D or 2D search is to use a running hash. In some embodiments, a 4-pixel running hash structure can be used. A running hash is calculated for every pixel in the horizontal direction to generate a horizontal hash array running_hash_h[ ]. Another running hash is calculated on top of running_hash_h[ ] to generate a 2D hash array running_hash_hv[ ]. Each value match in the 2D hash array running_hash_hv[ ] represents a 4×4 block match. To perform a 2D match, 4×4 block matches are found before performing a pixel-wise comparison to their neighbors. Since a pixel-wise comparison is limited to 1-3 pixels, the search speed can be increased dramatically.

From above description, the matched widths of each row are different from each other, thus each row has to be processed separately. To achieve efficiency and low complexity, embodiments of this disclosure provide a block based algorithm that can be used in both hardware and software implementations. Similar in some respects to standard motion estimation, this algorithm processes one rectangle block at a time.

Figure 8:
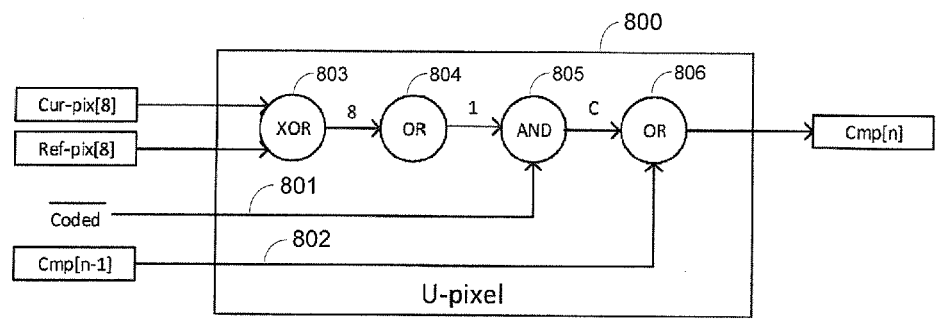
FIG. 8 illustrates an example of a basic pixel processing unit, called the U_PIXEL module.

FIG. 8 illustrates an example of a basic pixel processing unit in this algorithm, which is called the U_PIXEL module 800. The U_PIXEL module 800 receives a coded signal 801 and an input signal 802, and includes a plurality of logic gates 803-806. The coded signal 801 is a flag that indicates if the reference pixel has already been encoded from previous string match operation. Optionally, the input signal 802 (Cmp[n-1]) can be forced to "0", which allows removal of the last "OR" gate 806 from the U_PIXEL module 800.

Figure 9:
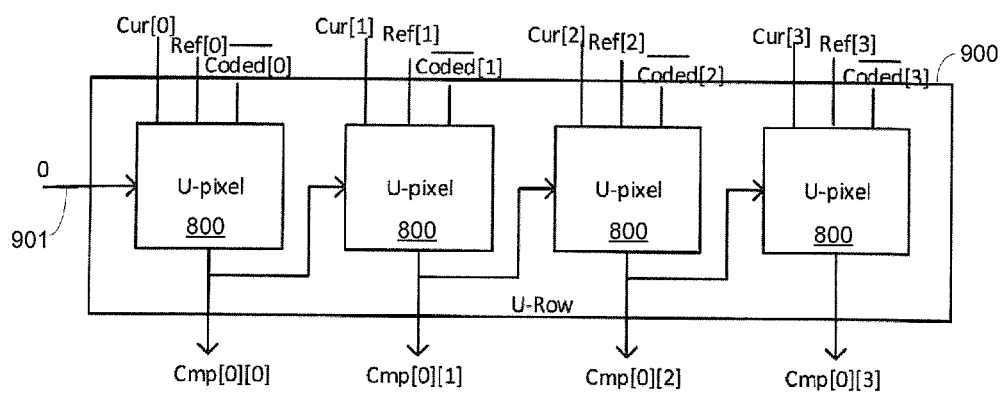
FIG. 9 illustrates an example of a U_ROW module.

Take a 4×4 block as example. The first step is to process each row in parallel. Each pixel in one row of the rectangle is assigned to one U_PIXEL module 800. A processing unit for processing each row is called a U_ROW module. FIG. 9 illustrates an example of a U_ROW module 900. The U_ROW module 900 includes a plurality of U_PIXEL modules 800. For the case of a 4×4 block, the U_ROW module 900 includes four U_PIXEL modules 800. As shown in FIG. 9, the U_ROW module 900 is processing the first row, row 0, as indicated at 901.

Figure 10:
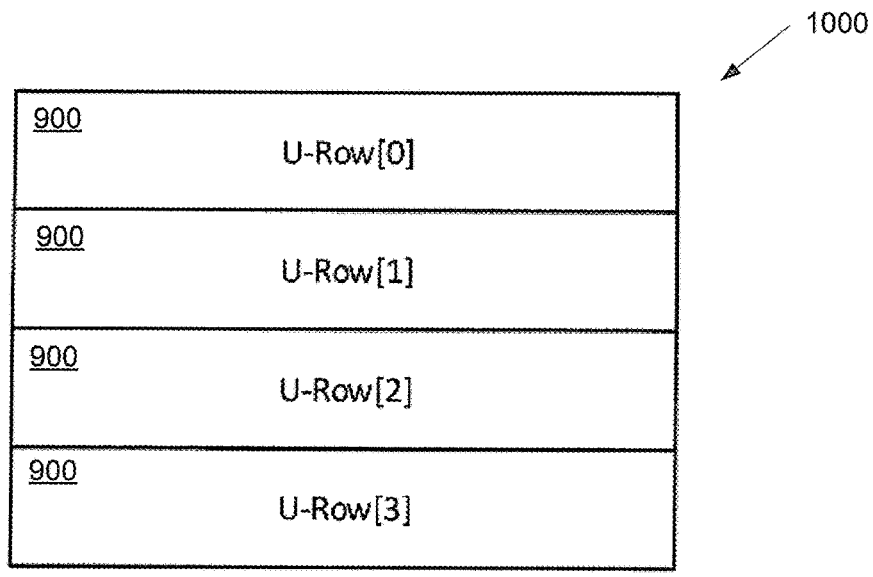
FIG. 10 illustrates an example of a U_CMP module.

Four U_ROW modules 900 are employed to process the four rows of the 4×4 block. The four U_ROW modules 900 can be arranged in parallel in a U_CMP module. FIG. 10 illustrates an example of a U_CMP module 1000 that includes four U_ROW modules 900. The output of the U_CMP module 1000 is an array cmp[4][4].

Figure 11:
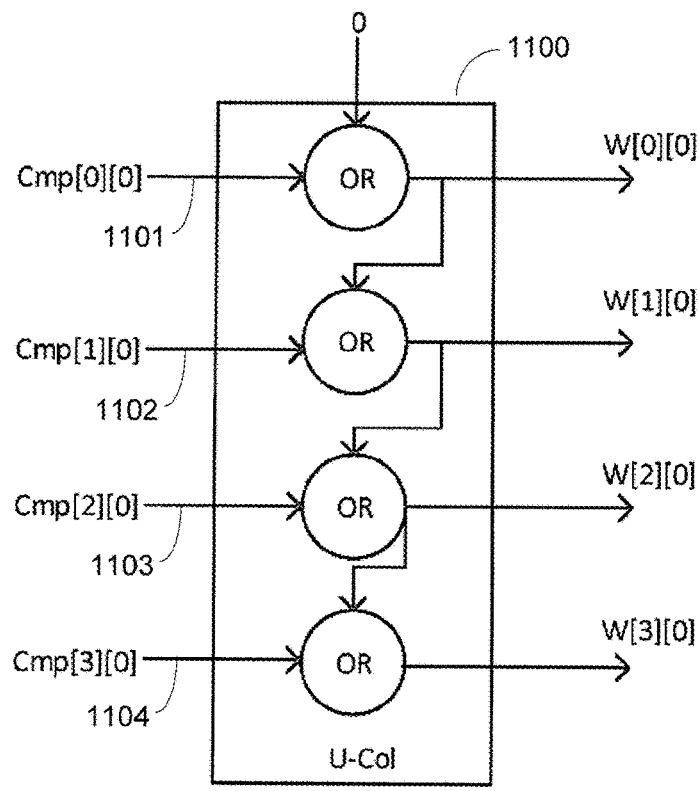
FIG. 11 illustrates an example of a U_COL module.
Figures 12, 13:
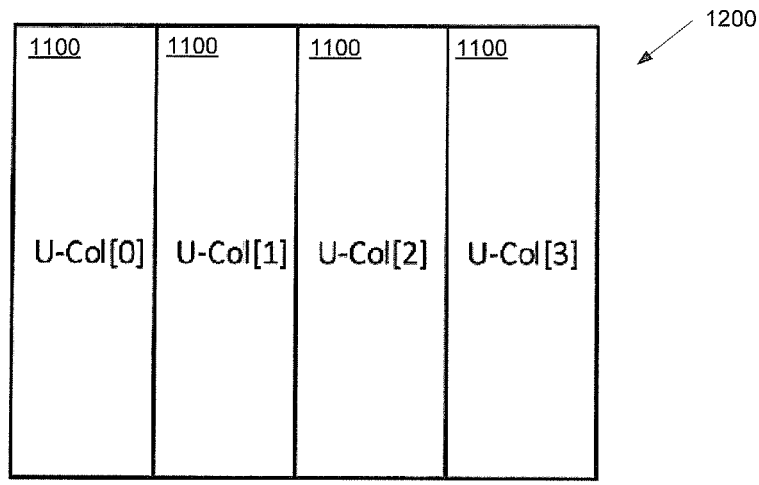
FIG. 12 illustrates an example U_2D_BLOCK module.
FIG. 13 illustrates examples of horizontal and vertical scanning for index map processing.

The next step of the algorithm is to process each column of the cmp array in parallel. Each cmp in a column of the cmp array is processed by a U_COL module. FIG. 11 illustrates an example of a U_COL module 1100 that receives four columns 1101-1104 of the cmp array. Four U_COL modules 1100 can be employed to process the four columns of the 4×4 block. The four U_COL modules 1100 can be arranged in parallel in a U_2D_BLOCK module. FIG. 12 illustrates an example U_2D_BLOCK module 1200 that includes four U_COL modules 1100. The output of the U_2D_BLOCK module 1200 is an array rw[4][4].

The number of zeros in each row of the array rw[n] [0-3] is then counted and the four results are recorded to an array r_width[n]. The array r_width[n] is the same as the array rwidth[n] in step 7 of the 2D matching technique described above. The array 1_width[n] is generated in the same manner. The min width array in step 7 can be obtained as {{1_width[1], r_width[1]}, {1_width[2], r_width[2]}, {1_width[3], r_width[3]} ... }.

This algorithm can be implemented in hardware or a combination of hardware and software to work in the parallel processing framework of any modern CPU (central processing unit), DSP (digital signal processor), or GPU (graphics processing unit). A simplified pseudo code for fast software implementation is listed below.

---

(Pseudo code):

// 1. Generate array C[ ][ ]
For(y = 0; y < height; ++y)
{
    For(x = 0; x < width; ++x)
    {
        tmp1 = cur_pixel ^ ref_pixel;
        tmp2 = tmp1[0] | tmp1[1] | tmp1[2] | tmp1[3] | tmp1[4] | tmp1[5] | tmp1[6]| tmp1[7];
        C[y][x] = tmp2 & (!coded[y][x]);
    }
}

---

(Pseudo code):

// 2. Generate array CMP[ ][ ]
For(y = 0; y < height; ++y)
{
    CMP[y][0] = C[y][0];
}
For(x = 1; x < width; ++x)
{
    For(y = 0; y < height; ++y)
    {
        CMP[y][x] = C[y][x] | CMP[y][x-1]
    }
}
// 3. Generate array RW[ ][ ] or LW[ ][ ]
For(x = 0; x < width; ++x)
{
    RW[0][x] = CMP[0][x];
}
For(y = 1; y < height; ++y)
{
    For(x = 0; x < width; ++x)
    {
        RW[y][x] = CMP[y][x] | RW[y-1][x];
    }
}
// 4. Convert RW[ ][ ] to R_WIDTH[ ]
For(y = 0; y < height; ++y)
{
    // count zero, or leading zero detection
    R_WIDTH[y] = LZD(RW[y][0], RW[y][1], RW[y][2], RW[y][3]);
}

---

As shown in the pseudo code above, there is no data dependence in each FOR loop so typical software parallel processing methods, such as loop unrolling or MMX/SSE, can be applied to increase the execution speed.

This algorithm can also apply to a 1D search if the number of rows is limited to one. A simplified pseudo code for fast software implementation of a fixed length based 1D search is listed below.

---

(Pseudo code):

// 1. Generate array C[ ]
For(x = 0; x < width; ++x)
{
    tmp1 = cur_pixel ^ ref_pixel;
    tmp2 = tmp1[0] | tmp1[1] | tmp1[2] | tmp1[3] | tmp1[4] | tmp1[5] | tmp1[6] | tmp1[7];
    C[x] = tmp2 & (!coded[x]);
}
// 2. Generate array RW[ ] or LW[ ]
If (last "OR" operation in U_PIXEL module is removed)
    Assign RW[ ] = C[ ]
Else {
    RW [0] = C[0];
    For(x = 1; x < width; ++x)
    {
        RW [x] = C[x] | RW [x-1]
    }
]
// 3. Convert RW[ ][ ] to R_WIDTH[ ]
// count zero, or leading zero detection
If(last "OR" operation in U_PIXEL module is removed)
    R_WIDTH = LZD(RW[0], RW[1], RW[2], RW[3]);
Else
    R_WIDTH[y] = COUNT_ZERO(RW[0], RW[1], RW[2], RW[3]);

---

After both of the 1D search and the 2D search are completed, the maximum of (1D length, 2D size (width×height)) is selected as the "winner." If the 1width (left width) of the 2D match is non-zero, the length of the prior 1D match (length=length−1width) can be adjusted to avoid an overlap between the prior 1D match and the current 2D match. If the length of the prior 1D match becomes zero after the adjustment, it should be removed from the match list.

Next, a starting location is calculated using current_location+length if the previous match is a 1D match, or current_location+(1width+rwidth) if the previous match is a 2D match. When a 1D search is performed, if any to-be-matched pixel falls into any previous 2D match region where its location has already been covered by a 2D match, the next pixel or pixels are scanned through until a pixel is found that has not been coded by a previous match.

After obtaining the matched pairs, an entropy engine can be applied to convert these coding elements into the binary stream. In some embodiments, the entropy engine can use an equal probability model. An advanced adaptive context model could be applied as well for better compression efficiency. The following pseudo code is an example of the encoding procedure for each matched pair.

(Pseudo code):

```
// loop for each CU, uiTotal=uiWidth*uiHeight, uiIdx=0;
while ( uiIdx < uiTotal) {
    // *pDist: store the distance value for each matched pair
    // *pIdx: store the index value for each matched pair
    // *pLen: store the length value for each matched pair
    // encodeEP( ) and encodeEPs( ) are reusing HEVC or similar
    by-pass entropy coding.
    if (pDist[uiIdx] == -1 )
    {
        //encode one-bin with equal-probability model to indicate the
        //whether current pair is matched or not.
        unmatchedPairFlag = TRUE;
        encodeEP(unmatchedPairFlag);
        //uiIndexBits is controlled by the palette table size
        // i.e., for 24 different colors, we need 5 bits, for 8 colors, 3 bits
        encodeEPs(pIdx[uiIdx], uiIndexBits);
        uiIdx++;
    }
    else
    {
        unmatchedPairFlag= FALSE;
        encodeEP(unmatchedPairFlag);
        /*bound binarization with max possible value*/
        UInt uiDistBits =0;
        // offset is used to add additional references from neighboring
        blocks
        // here, we first let offset=0;
        while( (1<<uiDistBits)<= (uiIdx+offset))
        {
            uiDistBits++;
        }
        encodeEPs(pDist[uiIdx], uiDistBits);
        /*bound binarization with max possible value*/
        UInt uiLenBits =0;
        while( (1<<uiLenBits)<= (uiTotal-uiIdx))
        {
            uiLenBits++;
        }
        encodeEPs(pLen[uiIdx], uiLenBits);
        uiIdx += pLen[uiIdx];
    }
}
```

Correspondingly, the decoding process for the matched pair is provided in the following pseudo code.

(Pseudo code):

```
// loop for each CU, uiTotal=uiWidth*uiHeight, uiIdx=0;
while ( uiIdx < uiTotal) {
    // *pDist: store the distance value for each matched pair
    // *pIdx: store the index value for each matched pair
    // *pLen: store the length value for each matched pair
    // parseEP( ) and parseEPs( ) are reusing HEVC or similar by-pass
```

-continued (Pseudo code):

```
    entropy coding.
    // parse the unmatched pair flag
    parseEP(&uiUnmatchedPairFlag);
    if (uiUnmatchedPairFlag )
    {
        parseEPs( uiSymbol, uiIndexBits );
        pIdx[uiIdx] = uiSymbol;
        uiIdx++;
    }
    else
    {
        /*bound binarization with max possible value*/
        UInt uiDistBits =0;
        // offset is used to add additional references from neighboring
        blocks
        // here, we first let offset=0;
        while( (1<<uiDistBits)<= (uiIdx+offset))
            uiDistBits++;
        UInt uiLenBits =0;
        while( (1<<uiLenBits)<= (uiTotal-uiIdx))
            uiLenBits++;
        parseEPs( uiSymbol, uiDistBits);
        pDist[uiIdx] = uiSymbol;
        parseEPs( uiSymbol, uiLenBits);
        pLen[uiIdx] = uiSymbol;
        for(UInt i=0; i< pLen[uiIdx]; i++)
            pIdx[i+uiIdx] = pIdx[i+uiIdx- pDist[uiIdx]];
        uiIdx += pLen[uiIdx];
    }
}
```

It is noted that only pixels at unmatched positions will be encoded into the bit stream. To have a more accurate statistical model, some embodiments may use only these pixels and their neighbors for the palette table derivation, instead of using all pixels in the CU.

For encoding modes that determine an index or delta output, the encoding results usually contain a limited number of unique values. Embodiments of this disclosure provide a second delta palette table to utilize this observation. This delta palette table can be created after all literal data are obtained in the current CU. The delta palette table can be signaled explicitly in the bit stream. Alternatively, it can be created adaptively during the coding process, so that the table does not have to be included in the bit stream. A delta_color_table_adaptive_flag is provided for this choice.

In some embodiments, another advanced scheme, called Neighboring Delta Palette Table Merge, is provided. For adaptive delta palette generation, the encoder can use the delta palette from the top or left CU as an initial starting point. For non-adaptive palette generation, the encoder can also use the delta palette from the top or left CU, and then compare the R-D cost among the top, left, and current CUs.

A delta_color_table_merge_flag is defined to indicate whether the current CU uses the delta palette table from its left or upper CU. The current CU carries the delta palette table signaling explicitly only when delta_color_table_adaptive_flag==0 and delta_color_table_merge_flag==0 at the same time. For the merging process, if delta_color_table_merge_flag is asserted, another flag, delta_color_table_merge_direction, is defined to indicate whether the merge candidate is from either the upper CU or the left CU.

If delta_color_table_adaptive_flag==1, the following is an example of an encoding process for adaptive delta palette generation. On the decoder side, whenever the decoder receives a literal data, the decoder can then regenerate the delta palette using the reverse steps.

Step 1: The arrays palette_table[ ] and palette_count[ ] are defined.

Step 2: The array palette_table[ ] is initialized as palette_table(n)=n (n=0 . . . 255). Alternatively, the palette_table[ ] from the top or left CU can be used as an initial value.

Step 3: The array palette_count[ ] is initialize as palette_count(n)=0 (n=0 . . . 255). Alternatively, the palette_count[ ] from the top or left CU can be used as an initial value.

Step 4: For any delta value c', the following operations are performed:
  a) Locate n so that palette_table(n)==delta c';
  b) Use n as the new index of delta c';
  c) ++palette_count(n);
  d) Sort palette_count[ ] so that it is in descending order; and
  e) Sort palette_table[ ] accordingly.

Step 5: The process returns to step 1 and the process is repeated until all delta c' in the current CU are processed.

For any block that includes both text and graphics, a mask flag can be used to separate the text section and graphics section. The text section can be compressed using the compression method described above; the graphics section can be compressed by another compression method. Because the value of any pixel covered by the mask flag has been coded by the text layer losslessly, each pixel in the graphics section can be considered as a "don't-care-pixel". When the graphics section is compressed, any arbitrary value can be assigned to a don't-care-pixel in order to obtain optimal compression efficiency.

The index map and residuals are generated during the palette table derivation process. Compressing the index map losslessly allows efficient processing using the 1D or 2D string search. In some embodiments, the 1D or 2D string search is constrained within the current CU; however, the search window can be extended beyond the current CU. The matched distance can be encoded using a pair of motion vectors in the horizontal and vertical directions, e.g., (MVy=matched_distance/cuWidth, MVy=matched_distance-cuWidth*MVy).

Because the image can have different spatial texture orientations at local regions, the 1D search can be performed in either the horizontal or vertical directions based on the value of a color_idx_map_pred_direction indicator. The optimal index scanning direction can be determined based on the R-D cost. FIG. 13 illustrates an example of horizontal and vertical scanning operations. In FIG. 13, an example 2D color index map 1301 is shown. The color index map 1301 can represent the color index map 311 of FIG. 3. The color index map 1301 is an 8×8 map, but other sizes of color index map are possible. As shown in FIG. 13, horizontal scanning 1302 or vertical scanning 1303 can be performed on the color index map 1301. In some embodiments, the deriveMatchPairs( ) and associated entropy coding steps are performed twice for both horizontal scanning and vertical scanning. Then the final scanning direction is chosen as the direction with the smallest R-D cost.

Improved Binarization

As shown above, the palette table and a pair of matched information for the color index map can be encoded using fixed length binarization. Alternatively, variable-length binarization can be used. For example, for palette table encoding, the palette table may have 8 different color values. Therefore, the corresponding color index map may contain only 8 different indices. Instead of using a fixed 3 bins to encode every index value equally, just one bin can be used to represent the background pixel. For example, the background pixel may be represented as 0. Then the remaining 7 pixel values can be represented using fixed-length codewords such as 1000, 1001, 1010, 1011, 1100, 1101, and 1110 to encode the color index. This is based on the fact that the background color may occupy the largest percentage of the image, and therefore a distinct codeword of only one bit for the background color could save space overall. This scenario occurs commonly for screen content. As an example, consider a 16×16 CU. Using fixed 3-bin binarization, the color index map requires 3×16×16=768 bins. Alternatively, let the background color, which occupies 40% of the image, be indexed as 0, while the other colors are equally distributed. In this case, the color index map only requires 2.8×16×16<768 bins.

For the matched pair encoding, the maximum possible value of the matched distance and length can be used to bound its binarization, given the current constraints of technology within the area of the current CU. Mathematically, the matched distance and length could be as long as 64×64=4K in each case. However, this typically would not occur jointly. For every matched position, the matched distance is bounded by the distance between the current position and the very first position in the reference buffer (e.g., the first position in the current CU), which can be indicated as L. Therefore, the maximum bins for the distance binarization is $\log_2(L)+1$ (instead of fixed length), and the maximum bins for the length binarization is $\log_2(\text{cuSize}-L)+1$ with cuSize=cuWidth*cuHeight.

In addition to the palette table and index map, residual coefficient coding could be significantly improved by different binarization methods. As for HEVC RExt and HEVC versions, the transform coefficient is binarized using the variable length based on the observation that the coefficient produced after prediction, transform and quantization using conventional methods has typically close-to-zero magnitude, and the non-zero values are typically located on the left-upper corner of the transform unit. However, after introducing the transform skip coding tool in HEVC RExt that enables bypassing the entire transform process, the residual magnitude distribution has changed. Especially when enabling the transform skip on the screen content with distinct colors, there commonly exist coefficients with large values (i.e., not close-to-zero values, such as '1', '2', or '0') and the non-zero values may occur at random locations inside the transform unit. If the current HEVC coefficient binarization is used, it may result in a very long code word. Alternatively, fixed length binarization can be used, which could save the code length for the residual coefficients produced by the palette table and index coding mode.

New Predictive Pixel Generation Method

As described above, a 1D/2D string search is performed in encoding the color index map. At any location in the color index map where a matched index has been found, the decoder takes the pixel at the matched location and subtracts it from the original pixel to generate a residual pixel. This procedure can be performed either by using the corresponding color in the color palette table represented by the color index at the matched location, or by using the reconstructed pixel at the matched location.

There are two methods to generate the prediction value based on the two methods described above. In the first method, for any target pixel location, a RGB value is derived from the palette table by the major color index at the matched location, and this RGB value is used as the prediction value of the target pixel. However, this method forces the decoder to perform a color index derivation procedure to the pixels that are outside of the current CU, resulting in an increase of decoding time.

To avoid the color index derivation procedure in the first method, a second method is applied where, for any target pixel location, the reconstructed pixel value at the matched location is used as the prediction value. In this method, the reconstructed value is not valid when the prediction pixel is within the current CU. In this case, however, a color index is available and its corresponding color in the color palette table can be used as the prediction pixel.

The residual value of any pixel in the current CU can be derived by subtracting its prediction value from the original value. It is then quantized and encoded into the bit-stream. The reconstructed value of any pixel in the current CU can be derived by adding its prediction value and the quantized residual value.

Single Color Mode

A single color CU can be either a CU with only one color at every pixel location or a CU having a single color in its palette with a uniform single-value index map. There are multiple methods to compress a single color CU in the palette mode. In one method, i.e., Single Color Mode, only this single color palette information is encoded and included in the bitstream. The entire color index map section is skipped. This is in contrast to encoding and transmitting the uniform all-zero index map. On the decoder side, if there is only a single color in the palette without an index map, every pixel location in the current CU will be filled up with the color in the palette Pixel Domain String Copy As described above, the 1D/2D string copy is applied in the color index map domain. The 1D/2D string copy can also be applied in the pixel domain. Compared to the index map domain 1D/2D string copy, the 1D/2D string copy in the pixel domain includes a number of changes. The changes are as follows:

1. The palette table and the index map generation process are not necessary and can be skipped. As an alternative, all palette table generation, index map generation, and 1D/2D string search on index domain are still performed, but the palette table is not written to the bit stream. A coded map is generated based on the length of the 1D string match or the width and height of the 2D string match. The coded map indicates whether a pixel location is covered by a previous match. The next starting location is the first location that is not covered by a previous match.

2. When coding unmatched data, its RGB value (instead of the color index value) is written to the bit stream. When coding unmatched data, a pixel index coding method can also be applied where a one-bit flag is added in front of this RGB value in the syntax table. If this RGB value appears for the first time, the flag is set to 1 and this RGB value itself is coded to the bit stream. This RGB value is added to a lookup table after that. If this RGB value appears again, the flag is set to 0 and the lookup table index value instead of this RGB value is coded.

3. The predictive pixel generation method uses Option 2 of the single color mode (the reconstructed pixel value from the prediction pixel location is used as the prediction value).

4. For a single color CU, either Option 1 or Option 2 of the single color mode can be selected. When Option 1 is selected, the RGB value of the major color is written to the palette table section of the bit stream. When Option 2 is selected, if no upper line is used in the 1D search and no 2D option is allowed for the current CU, the RGB value of the major color is written to the palette table section of the bit stream.

In general, the 2D string copy is a flexible algorithm; it can perform operations on blocks of different widths and heights to find a match block. When the 2D string copy is constrained to the width and height of the CU, the 2D string copy becomes a fixed width/height block copy. Intra block copy (IBC) is substantially identical to this particular case of the 2D string copy that operates on the fixed width/height block. In the fixed width/height 2D string copy, the residual is encoded as well. This is also substantially identical to the residual coding method used by IBC.

Adaptive Chroma Sampling for Mixed Content

The embodiments described above provide various techniques for high-efficiency screen content coding under the framework of the HEVC/HEVC-RExt. In practice, in addition to pure screen content (such as text, graphics) or pure natural video, there is also content containing both computer-generated screen material and camera-captured natural video. This is referred to as mixed content. Currently, mixed content is processed with 4:4:4 chroma sampling. However, for the embedded camera-captured natural video portion in such mixed content, the 4:2:0 chroma sampling may be sufficient to provide perceptually lossless quality. This is due to the fact that human vision is less sensitive to the spatial changes in chroma components compared to that from the luma components. Hence, sub-sampling typically is performed on the chroma components (e.g., the popular 4:2:0 video format) to achieve noticeable bit rate reduction while maintaining the same reconstructed visual quality.

Figures 14A, 14B:
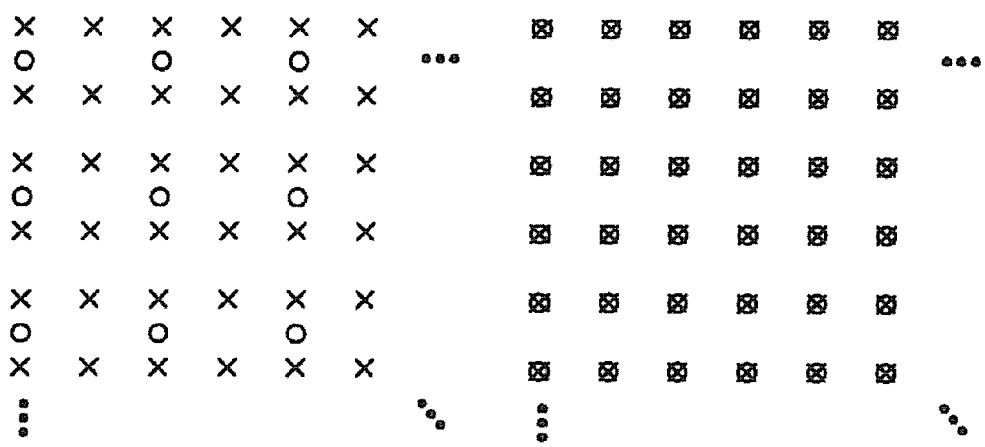
FIGS. 14A and 14B illustrate examples of 4:2:0 and 4:4:4 chroma sampling formats.

Embodiments of this disclosure provide a flag, enable_chroma_subsampling, which is defined and signaled at the CU level recursively. For each CU, the encoder determines whether it is being coded using 4:2:0 or 4:4:4 according to the rate-distortion cost. FIGS. 14A and 14B illustrate examples of 4:2:0 and 4:4:4 chroma sampling formats. FIG. 14A shows an example of 4:2:0 sampling and FIG. 14B shows an example of 4:4:4 sampling.

At the encoder side, for each CU, assuming the input is the 4:4:4 source shown in FIG. 14B, the rate-distortion cost is derived directly using the 4:4:4 encoding procedure with enable_chroma_subsampling=0 or FALSE. Then, the process sub-samples 4:4:4 samples to 4:2:0 to derive its bit consumption. The reconstructed 4:2:0 format is interpolated back to the 4:4:4 format for distortion measurement (e.g., using sum of squared error (SSE), or sum of absolute difference (SAD)). Together with the bit consumption, the rate-distortion cost is derived when encoding the CU at the 4:2:0 space and comparing it with the cost when encoding the CU at 4:4:4. Whichever encoding method results in the lower rate-distortion cost is then chosen for the final encoding.

Figure 15:
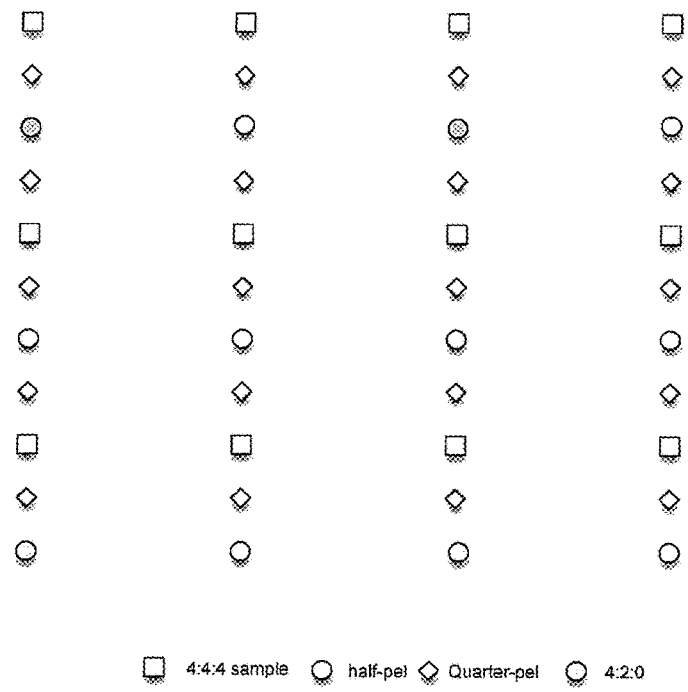
FIG. 15 illustrates an example of an interpolation process from 4:4:4 to 4:2:0 and vice versa.

FIG. 15 illustrates an example of the interpolation process from 4:4:4 to 4:2:0 and vice versa. Typically, the video color sampling format conversion process may require a large number of interpolation filters. To reduce the implementation complexity, an HEVC interpolation filter (i.e., DCT-IF) may be utilized. As shown in FIG. 15, the square boxes represent the original 4:4:4 samples. From 4:4:4 to 4:2:0, the half-pel pixels (represented by the circles) are interpolated using DCT-IF vertically for the chroma components. Also shown in FIG. 15 are the quarter-pel positions, which are represented by the diamonds. The grey shaded circles are selected to form the 4:2:0 samples. For the interpolation from 4:2:0 to 4:4:4, the process starts with the grey circles in the chroma components, the half-pel positions are interpolated horizontally to obtain all circles, and then the square boxes are interpolated using DCT-IF vertically. All of the interpolated square boxes are selected to form the reconstructed 4:4:4 signal.

Encoder Control

As discussed above, multiple flags are provided to control the low-level processing at the encoder. For example, enable_packed_component_flag is used to indicate whether the current CU uses its packed format or a conventional planar format for encoding the processing. The decision whether or not to enable packed format could depend on the R-D cost calculated at the encoder. In some encoder implementations, a low-complexity solution could be achieved by analyzing the histogram of the CU and finding the best threshold for the decision.

The size of the palette table has a direct impact on the complexity. A parameter maxColorNum is introduced to control the trade-off between complexity and coding efficiency. The most straightforward way is choosing the option that results in the lowest R-D cost. The index map encoding direction could be determined by R-D optimization, or by using a local spatial orientation (e.g., edge direction estimation using a Sobel operator).

Figure 16:
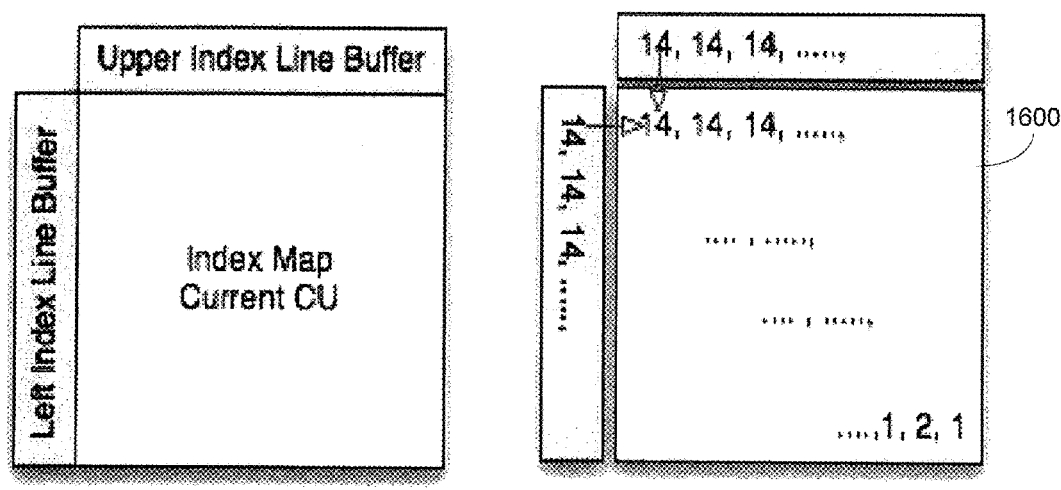
FIG. 16 illustrates an example of color index map processing using an upper index line buffer or a left index line buffer.

Some of the embodiments described above may limit the processing within every CTU or CU. In practice, this constraint can be relaxed. For example, for color index map processing, the line buffer from the upper CU or left CU can be used, as shown in FIG. 16. FIG. 16 illustrates an example of color index map processing using an upper index line buffer or a left index line buffer. With the upper buffer and left buffer, the search can be extended to further improve the coding efficiency. Given that upper and left buffers are formed using the reconstructed pixels from neighboring CUs, these pixels (as well as their corresponding indices) are available for reference before processing the current CU index map. For example, as shown in FIG. 16, after re-ordering, the current CU index map 1600 could be 14, 14, 14, . . . 1, 2, 1 (presented as a 1D string). Without a line buffer reference, the first "14" might be coded as an unmatched pair. However, with a neighboring line buffer, the first "14" matches the "14" in either the upper index line buffer or the left index line buffer. Thus, the string copy can start at the very first pixel.

Decoder Syntax

The information provided below can be used to describe the decoding operations of the receiver 200 shown in FIG. 2. The syntax shown below is aligned with a committee draft of HEVC RExt.

7.3.5.8 Coding unit syntax:

| | Descriptor |
|---|---|
| coding_unit( x0, y0, log2CbSize ) { | |
| if( transquant_bypass_enabled_flag ) | |
|   cu_transquant_bypass_flag | ae(v) |
| if( slice_type != I ) | |
|   cu_skip_flag[ x0 ][ y0 ] | ae(v) |
| nCbS = ( 1 << log2CbSize ) | |
| if( cu_skip_flag[ x0 ][ y0 ] ) | |
|   prediction_unit( x0, y0, nCbS, nCbS ) | |
| else { | |
|   if( intra_block_copy_enabled_flag ) | |
|     intra_bc_flag[ x0 ][ y0 ] | ae(v) |
|   if( color_table_enabled_flag ) | |
|     color_table_flag[ x0 ][ y0 ] | ae(v) |
|   if( delta_color_table_enabled_flag ) | |
|     delta_color_table_flag[ x0 ][ y0 ] | ae(v) |
|   if( !intra_bc_flag[ x0 ][ y0 ] ) { | |
|     if( slice_type != I ) | |
|       pred_mode_flag | ae(v) |

-continued

| | Descriptor |
|---|---|
|     if ( CuPredMode[ x0 ][ y0 ] != MODE_INTRA \|\| | |
|       log2CbSize = = MinCbLog2SizeY ) | |
|       part_mode | ae(v) |
|   } | |
|   if( CuPredMode[ x0 ][ y0 ] = = MODE_INTRA ) { | |
|     if( PartMode = = PART_2Nx2N && | |
|     pcm_enabled_flag && | |
| !intra_bc_flag | |
|       log2CbSize >= Log2MinIpcmCbSizeY && | |
|       log2CbSize <= Log2MaxIpcmCbSizeY ) | |
|       pcm_flag[ x0 ][ y0 ] | ae(v) |
|     if( pcm_flag[ x0 ][ y0 ] ) { | |
|       while( !byte_aligned( ) ) | |
|         pcm_alignment_zero_bit | f(1) |
|       pcm_sample( x0, y0, log2CbSize ) | |
|     } else if( intra_bc_flag[ x0 ][ y0 ] ) { | |
|       mvd_coding( x0, y0, 2) | |
|   } else if( color_table_flag[x0][y0] \|\| | |
| delta_color_table_flag[x0][y0] ) { | |
|     enable_packed_component_flag | ae(v) |
|     if(color_table_flag[x0][y0] ) { | |
|       color_table_merge_flag | ae(v) |
|       if (color_table_merge_flag){ | |
|         color_table_merge_idx | ae(v) |
|       }else{ | |
|         color_table_size | ae(v) |
|         for(i=0;i< color_table_size;i++) | |
|           color_table_entry[i] | ae(v) |
|       } | |
|       color_idx_map_pred_direction | ae(v) |
|     } | |
|     if(delta_color_table_flag[x0][y0] ) { | |
|       delta_color_table_adaptive_flag | ae(v) |
|       delta_color_table_merge_flag | ae(v) |
|       if (delta_color_table_merge_flag){ | |
|         delta_color_table_merge_idx | ae(v) |
|       }else if (!delta_color_table_adaptive_flag){ | |
|         delta_color_table_size | ae(v) |
|         for(i=0;i< delta_color_table_size;i++) | |
|           delta_color_table_entry[i] | ae(v) |
|       } | |
|     } | |
|   Pos=0; cuWidth=1<<log2CbSize; | |
|   cuHeight=1<<log2CbSize; | |
|   while (Pos<cuWidth*cuHeight){ | |
|     matched_flag | ae(v) |
|     if(matched_flag ) { | |
|       matched_distance /*MVx, MVy*/ | ae(v) |
|       matched_length | ae(v) |
|     }else{ | |
|       index_delta | ae(v) |
|     } | |
|   } | |
|   } else { | |
|     .....pbOffset = ( PartMode = = PART_NxN ) | |
|     ? ( nCbS / 2 ) : | |
| nCbS | |
| .... | |

Figure 17:
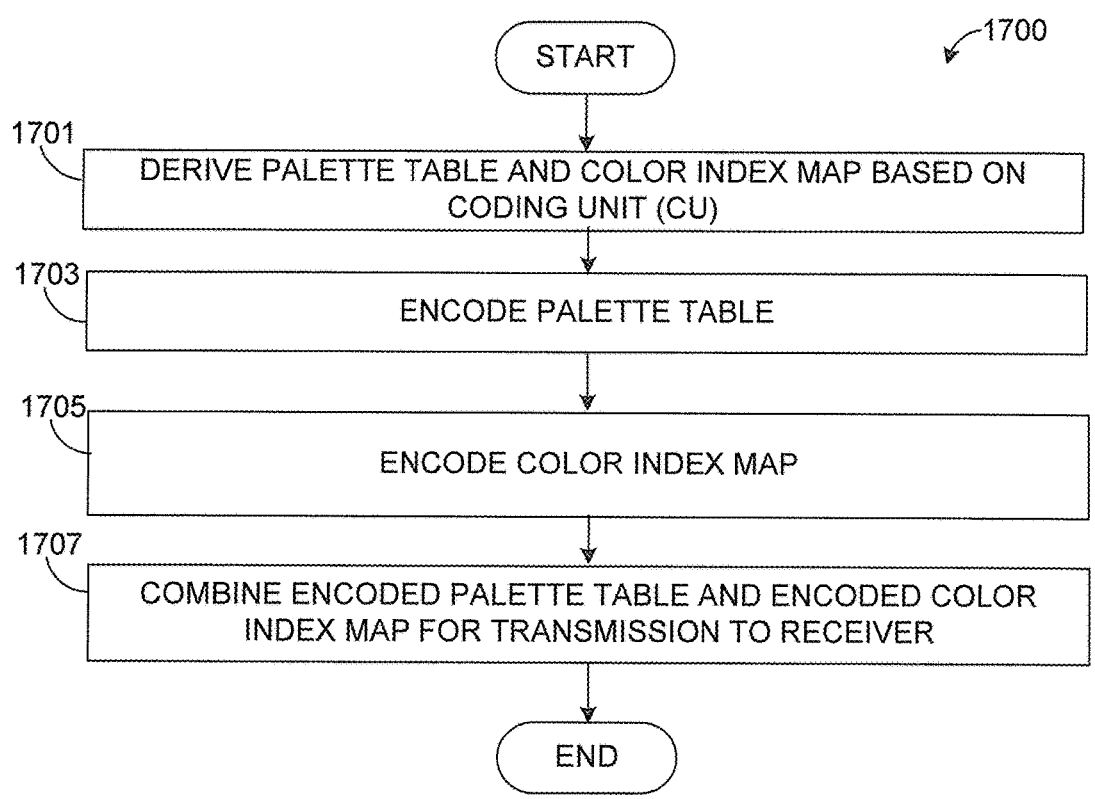
FIG. 17 illustrates a method for optimized route mobility management according to this disclosure.

FIG. 17 illustrates a method for screen content coding according to this disclosure. The method 1700 shown in FIG. 17 is based on the key concepts described above. The method 1700 may be performed by the transmitter 100 of FIG. 1. However, the method 1700 could also be used with any other suitable device or system.

At operation 1701, a device derives a palette table and a color index map based on a current CU. For example, this may include applying a hash-based grouping process on histogram-ordered color data to represent similar colors with a common entry in the palette table with low complexity. Applying the hash-based grouping process may include generating a hash representation of each color component using a hash function, where the hash function includes (G>>X<<(16+X))|(B>>X<<(8+X))|(R>>X<<X) or (Y>>X<<(16+X))|(Cb>>X<<(8+X))|(Cr>>X<<X), where X depends on QP. Applying the hash-based grouping process may further include associating each color to its representation hash value; and retrieving one or more colors from a given hash value.

At operation 1703, the device encodes the palette table. This may include using a predictor palette to store a previously coded color in the palette table or a predictor palette associated with a left CU or an upper CU of the CU, and encoding the palette table using the predictor palette. This may further include updating the predictor palette at the end of encoding of the CU, and carrying the predictor palette to the next CU if the CU is not coded in the palette mode.

At operation 1705, the device encodes the color index map. Later, at operation 1707, the device combines the encoded palette table and the encoded color index map for transmission to a receiver. In some embodiments, the CU is a single color CU, and only a single color palette table associated with the single color is encoded and transmitted to the receiver, such that the color index map is not transmitted to the receiver.

Although FIG. 17 illustrates one example of a method 1700 for screen content coding, various changes may be made to FIG. 17. For example, while shown as a series of steps, various steps shown in FIG. 17 could overlap, occur in parallel, occur in a different order, or occur multiple times. Moreover, some steps could be combined or removed and additional steps could be added according to particular needs.

Figure 18:
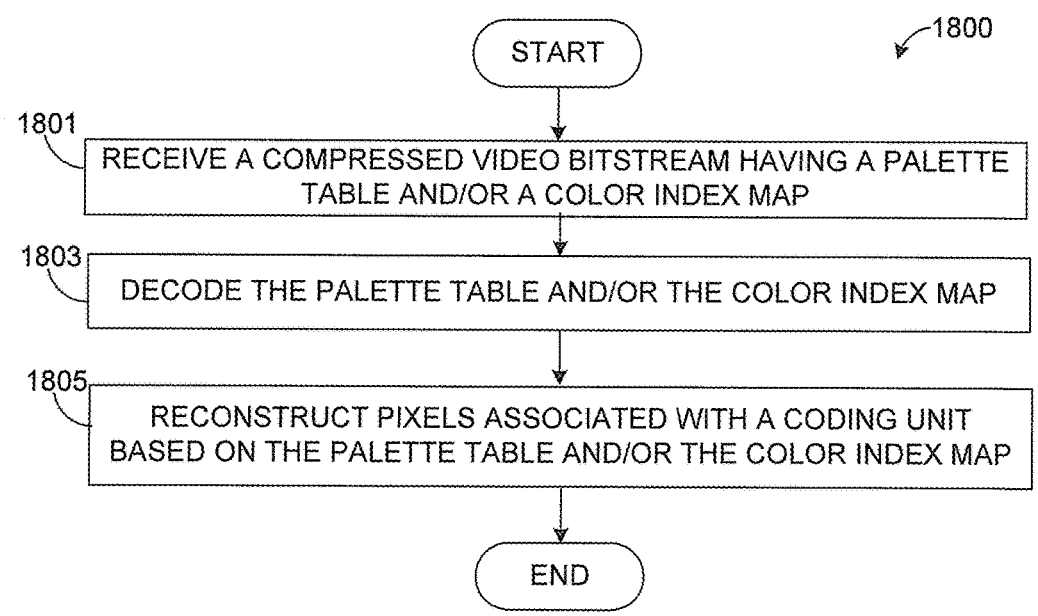
FIG. 18 illustrates a method for optimized route mobility management according to this disclosure.

FIG. 18 illustrates a method for screen content decoding according to this disclosure. The method 1800 shown in FIG. 18 is based on the key concepts described above. The method 1800 may be performed by the receiver 200 of FIG. 2. However, the method 1800 could also be used with any other suitable device or system.

At operation 1801, a device receives a compressed video bitstream from a transmitter. The video bitstream includes an encoded palette table and/or an encoded color index map. In some embodiments, the palette table was previously derived at the transmitter using a hash-based grouping process on histogram-ordered color data to represent similar colors with a common entry in the palette table with low complexity.

At operation 1803, the device decodes the palette table and/or the color index map. In some embodiments, decoding the palette table includes determining a predictor palette, where the predictor palette stores a previously decoded color in the palette table, and then decoding the palette table based on the predictor palette. In some embodiments, the predictor palette is associated with a left CU or an upper CU of the CU. Later, at operation 1805, the device reconstructs pixels associated with a current CU based on the palette table and/or the color index map.

In some embodiments, the device receives a bitstream of the palette table from the video bitstream. The device determines an indicator that specifies a maximum number of possible colors in the palette table for the CU. Later, the device receives a bitstream of the color index map from the video bitstream when the indicator specifies that the maximum number of possible colors in the palette table for the CU is not one.

Although FIG. 18 illustrates one example of a method 1800 for screen content decoding, various changes may be made to FIG. 18. For example, while shown as a series of steps, various steps shown in FIG. 18 could overlap, occur in parallel, occur in a different order, or occur multiple times. Moreover, some steps could be combined or removed and additional steps could be added according to particular needs.

In some embodiments, some or all of the functions or processes of the one or more of the devices are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for screen content decoding, the method comprising:
   receiving a video bitstream comprising at least one of a palette table and a color index map;
   receiving a bitstream of the palette table from the video bitstream;
   determining an indicator, wherein the indicator specifies a maximum number of possible colors in the palette table for a current coding unit (CU);
   receiving a bitstream of the color index map from the video bitstream when the indicator specifies that the maximum number of possible colors in the palette table for the current CU is not one;
   decoding the at least one of the palette table and the color index map;
   reconstructing pixels associated with the current CU based on the at least one of the palette table and the color index map; and
   displaying, on a display of an electronic device, an image generated using the pixels that were reconstructed.

2. The method of claim 1, wherein decoding the palette table comprises:
   determining a predictor palette, wherein the predictor palette stores a previously decoded color in the palette table; and
   decoding the palette table based on the predictor palette.

3. The method of claim 2, wherein the predictor palette is associated with a left CU or an upper CU of the current CU or a previously decoded CU in a palette mode.

4. The method of claim 2, further comprising:
updating the predictor palette at an end of decoding of the current CU based on the predictor palette if the current CU is decoded in a palette mode.

5. The method of claim 2, further comprising:
preserving the predictor palette if the current CU is not decoded in a palette mode.

6. The method of claim 1, further comprising:
receiving an enable_packed_component_flag that indicates an encoding mode associated with the palette table; and
receiving a color_table_merge_flag and a color_table_merge_direction flag, the flags respectively indicating a merge decision and a merge direction associated with the palette table.

7. The method of claim 1, further comprising:
receiving a position indicator of a two-dimensional (2D) string copy from the video bitstream, wherein the 2D string copy is a fixed width/height block copy; and
calculating a position of a block in a current picture of the video bitstream based on the position indicator of the 2D string copy, wherein the block in the current picture is previously decoded.

8. The method of claim 7, wherein the position indicator is one of: a map, a pair of vectors, and an offset.

9. An apparatus configured for screen content decoding, the apparatus comprising:
at least one memory; and
at least one processor coupled to the at least one memory, the at least one processor configured to:
receive a video bitstream comprising at least one of a palette table and a color index map;
receive a bitstream of the palette table from the video bitstream;
determine an indicator, wherein the indicator specifies a maximum number of possible colors in the palette table for a current coding unit (CU);
receive a bitstream of the color index map from the video bitstream when the indicator specifies that the maximum number of possible colors in the palette table for the current CU is not one;
decode the at least one of the palette table and the color index map; and
reconstruct pixels associated with the current CU based on the at least one of the palette table and the color index map; and
a display coupled to the processor, the display configured to display an image generated using the pixels that were reconstructed.

10. The apparatus of claim 9, wherein to decode the palette table, the at least one processor is configured to:
determine a predictor palette, wherein the predictor palette stores a previously decoded color in the palette table; and
decode the palette table based on the predictor palette.

11. The apparatus of claim 10, wherein the predictor palette is associated with a left CU or an upper CU of the current CU or a previously decoded CU in a palette mode.

12. The apparatus of claim 9, wherein the at least one processor is further configured to:
receive an enable_packed_component_flag that indicates an encoding mode associated with the palette table; and
receive a color_table_merge_flag and a color_table_merge_direction flag, the flags respectively indicating a merge decision and a merge direction associated with the palette table.

13. The method of claim 1, wherein no color index map is received when the current CU is a single color CU.

* * * * *